(12) United States Patent
Ross et al.

(10) Patent No.: US 10,815,008 B2
(45) Date of Patent: Oct. 27, 2020

(54) LIFT PROPULSION MODULE FOR A TILTROTOR AIRCRAFT

(71) Applicant: Bell Helicopter Textron Inc., Fort Worth, TX (US)

(72) Inventors: Brent C. Ross, Flower Mound, TX (US); Kendall Goodman, Southlake, TX (US); Steven R. Ivans, Ponder, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 463 days.

(21) Appl. No.: 15/662,147

(22) Filed: Jul. 27, 2017

(65) Prior Publication Data

US 2019/0031371 A1 Jan. 31, 2019

(51) Int. Cl.
*G06F 30/15* (2020.01)
*B64F 5/10* (2017.01)
(Continued)

(52) U.S. Cl.
CPC .......... *B64F 5/10* (2017.01); *B64C 1/00* (2013.01); *B64C 29/0033* (2013.01); *B64F 5/00* (2013.01); *G06F 30/15* (2020.01)

(58) Field of Classification Search
CPC .................. B64F 5/10; B64C 13/16
(Continued)

(56) References Cited

U.S. PATENT DOCUMENTS 4,417,708 A  11/1983 Negri
4,579,530 A  4/1986 McLaughlin
(Continued)

FOREIGN PATENT DOCUMENTS

DE  202005005843 U1  11/2005
EP  3434602 A1  1/2019
(Continued)

OTHER PUBLICATIONS

EP Exam Report, dated Feb. 21, 2019, by the EPO, re EP Patent App No. 17198171.5.
(Continued)

*Primary Examiner* — Thai Q Phan
(74) *Attorney, Agent, or Firm* — Timmer Law Group, PLLC

(57) ABSTRACT

A method for facilitating the design and manufacturing of a tiltrotor aircraft, including the steps of: determining a compatible mission data set; identifying lift propulsion module components for the compatible mission data set; determining compatible specifications; and generating a design for a lift propulsion module; wherein the lift propulsion module is configured to be connected to at least two different fuselages. There is also a method of designing a tiltrotor aircraft, comprising the step of modularizing a lift propulsion system, wherein the lift propulsion system is configured to be connected to at least two different fuselages. In another aspect, there is a tiltrotor aircraft including a fuselage; and a lift propulsion module, the lift propulsion module including a mounting surface; wherein the lift propulsion module is coupled to the fuselage on the mounting surface. Also included are methods of assembling and systems including a lift propulsion module.

16 Claims, 20 Drawing Sheets

(51) Int. Cl.
*B64C 29/00* (2006.01)
*B64F 5/00* (2017.01)
*B64C 1/00* (2006.01)

(58) Field of Classification Search
USPC .......... 703/2, 5, 6, 7, 8; 244/7 C, 7 R, 6, 55
See application file for complete search history.

(56) References Cited

U.S. PATENT DOCUMENTS

| | | |
|---|---|---|
| 4,691,878 A | 9/1987 | Vaughan et al. |
| 5,054,716 A | 10/1991 | Wilson |
| 5,337,974 A | 8/1994 | Rumberger et al. |
| 6,307,576 B1 | 10/2001 | Rosenfeld |
| 6,611,278 B2 | 8/2003 | Rosenfeld |
| 7,168,162 B2 | 1/2007 | Grube et al. |
| 7,292,908 B2 | 11/2007 | Borne et al. |
| 7,657,988 B2 | 2/2010 | Greene |
| 7,931,233 B2 | 4/2011 | Arafat et al. |
| 8,292,216 B1 | 10/2012 | Rumberger, Jr. |
| 9,009,012 B2 | 4/2015 | Bake et al. |
| 9,115,504 B2 | 8/2015 | Wallance |
| 9,126,293 B2 | 9/2015 | Uto et al. |
| 9,164,722 B2 | 10/2015 | Hall |
| 9,376,206 B2 | 6/2016 | Ross et al. |
| 9,405,333 B1 | 8/2016 | Pine |
| 9,420,764 B2 | 8/2016 | Miron et al. |
| 9,540,101 B2* | 1/2017 | Paduano ................ B64C 13/16 |
| 9,588,438 B2 | 3/2017 | Hsu et al. |
| 9,682,774 B2* | 6/2017 | Paduano ................ B64C 13/16 |
| 9,690,891 B2 | 6/2017 | Fan |
| 2011/0315806 A1 | 12/2011 | Piasecki et al. |
| 2012/0119016 A1* | 5/2012 | Shaw ...................... B64C 27/20 244/12.3 |
| 2012/0292435 A1 | 11/2012 | Karem |
| 2012/0301299 A1* | 11/2012 | Sherrill ................ B64C 27/473 416/144 |
| 2013/0206921 A1* | 8/2013 | Paduano ................ B64C 13/16 244/7 C |
| 2015/0000766 A1 | 1/2015 | Arizpe et al. |
| 2015/0021430 A1* | 1/2015 | Paduano ................ B64C 13/16 244/47 |
| 2015/0197335 A1* | 7/2015 | Dekel ................ B64C 29/0033 701/5 |
| 2015/0217613 A1* | 8/2015 | Piasecki ................ G05D 1/102 701/2 |
| 2015/0336663 A1* | 11/2015 | Paduano ................ B64C 13/16 244/12.4 |
| 2017/0233069 A1* | 8/2017 | Apkarian ................ B64F 5/10 244/7 R |

FOREIGN PATENT DOCUMENTS

| | | |
|---|---|---|
| WO | 2004101358 A2 | 11/2004 |
| WO | 2004101358 A3 | 2/2005 |

OTHER PUBLICATIONS

European Search Report, dated May 7, 2018, by the EPO, re EP Patent Application No. 17198171.5.
EP Exam Report, dated Jun. 1, 2018, by the EPO, re EP Patent Application No. 17198171.5.

* cited by examiner

LIFT PROPULSION MODULE FOR A TILTROTOR AIRCRAFT

BACKGROUND

Technical Field

The present disclosure relates to the design and manufacture of a tiltrotor aircraft, and more particularly, to the design and manufacture of a tiltrotor aircraft using a lift propulsion module.

Description of Related Art

The conventional method for manufacturing a tiltrotor aircraft involves multiple steps of design and assembly for each particular aircraft. For example, FIG. 3A illustrates a simplified overview of the steps to design and manufacture a single tiltrotor aircraft 150. Initially, customer requirements for a new aircraft are determined in step 151. For a commercial aircraft or an unsolicited military application, an extensive requirements assessment and business case analysis is conducted in step 153a where the aircraft's design mission and required performance is determined coupled with market potential. Once a favorable market potential is identified warranting investment, the aircraft high level requirements down to individual requirements are determined to satisfy the design mission or missions and business case while meeting certification requirements and manufacturer best practices. Alternatively, for a military aircraft, extensive performance requirements and specifications are analyzed in step 153b. The performance requirements provided by the military can be specific for the aircrafts mission and combined with the aircraft manufacturer's analysis of options and best practices in step 153b.

High level design requirements for the aircraft can be determined in step 155 by engineers based on the information customer requirements in either step 153a or step 153b. The high level design requirements can include determining aircraft size, rotor hover capability, and wing cruise capability. Rotor hover capability can be the resultant payload for hover at specified altitude and temperature. Cruise capability can be characterized by payload capability over a given range or loiter time. These high level design requirements and others are then used to determine final performance parameters including rotor size, wing size, rotor efficiency, blade loading, wing loading and efficiency, transmission horsepower requirements, engine horsepower and fuel consumption requirements, fuel system quantity requirements, and fuselage requirements.

The high level design requirements and final performance requirements filter down to subsystem requirements. The subsystem requirements are determined in step 156 and are based, at least in part on the high level and final performance requirements. Subsystem requirements can include flight control system, electrical system, fire suppression system, and hydraulic architectures for a functioning and certifiable vehicle.

Material is procured for production of the aircraft occurs in step 157. Step 158 involves component and subassembly manufacturing involves multiple steps to make component and structural parts fit together for the aircraft and can involve drilling, reaming, cutting, and other steps needed for assembly. Systems such as the fuel, electrical, hydraulic, fire suppression systems are then integrated in step 159 into the components and structure as required by the tiltrotor aircraft design. Thereafter, the tiltrotor aircraft goes through certification and delivery to the client in step 160 and is placed in service in step 162. The tiltrotor aircraft will be involved in a particular maintenance and service 164 as dictated by the design and specification of the tiltrotor aircraft.

The conventional process 150 results in a tiltrotor aircraft precisely tailored to the initial customer requirements in step 151. The conventional process 150 for manufacturing a tiltrotor aircraft is a slow and laborious process that requires engineering and manufacturing tailored to each aircraft produced, which can take years and hundreds or thousands of hours of engineering. The conventional process 150 tends to result in tiltrotor aircraft produced with minimal parts commonality, while incurring duplicative logistics and cost. Even when the design missions are similar for two aircraft, the two aircraft may look indistinguishable to the casual observer, but have no commonality of construction. Each particular aircraft can have custom parts, which can require custom spares for maintenance and repair.

There is a need for an improved method of designing and manufacturing a tiltrotor aircraft involving a modular system, apparatus, or method that addresses one or more of the foregoing issues.

SUMMARY

In a first aspect, there is a method for facilitating the design and manufacturing of a tiltrotor aircraft, including the steps of: determining a compatible mission data set; identifying lift propulsion module components for the compatible mission data set; determining compatible specifications; and generating a design for a lift propulsion module; wherein the lift propulsion module is configured to be connected to at least two different fuselages.

In an embodiment, the determining a compatible mission data set step includes identifying at least two design missions; determining a performance value for each design mission; identifying constraints associated with the performance values; harmonizing the performance values; and optimizing the performance values.

In one embodiment, the at least two design missions comprise a utility military mission, an attack military mission, and a commercial mission.

In an exemplary embodiment, the at least two design missions are different.

In still another embodiment, the performance value comprises at least one of the following speed, range, payload, loiter time, hover requirements, and aircraft weight.

In an embodiment, the lift propulsion module components comprising a rotor system, a wing member, and operational systems therefor.

In yet another embodiment, the identifying lift propulsion module components, further includes the steps of generating a mounting surface for the wing member based on the compatible mission data set, the mounting surface is configured to be connected with at least two different fuselages.

In another embodiment, the determining compatible specification step, includes the steps of identifying certification and airworthiness requirements; harmonizing the certification and airworthiness requirements; and optimizing the certification and airworthiness requirements.

In an embodiment, the airworthiness certification includes at least one of the following: a standard airworthiness certification, a special airworthiness certification, and combinations thereof.

In one embodiment, the commercial certification comprises at least one of the following: of 14 CFR Part 25, 15

CFR Part 27, 14 CFR Part 29, 14 CFR Part 33, TR additions, 609 Certification Basis, tiltrotor regulations, and combinations thereof.

In another embodiment, the military certification is selected from the group consisting of MIL-HDBK-516, ADS-51-HDBK, AMCP 706-203, SD-572, and AR-56, military regulations, and combinations thereof.

In still another embodiment, the at least two different fuselages are at least two of the following: a pressurized cabin, an unpressurized cabin, a cargo fuselage, a military fuselage, an unmanned aerial vehicle fuselage, and a military fuselage configured for shipboard wing and rotor stow.

In an embodiment, the method further includes providing the lift propulsion module.

In another embodiment, the method further includes generating a design for a fuselage.

In yet another embodiment, the method includes providing a fuselage; and connecting the lift propulsion module and the fuselage.

In still another embodiment, the fuselage comprises at least one the following: a pressurized cabin, an unpressurized cabin, a cargo fuselage, a military fuselage, an unmanned aerial vehicle fuselage, and a military fuselage configured for shipboard wing and rotor stow.

In an embodiment, the lift propulsion module is manufactured separately from the fuselage.

In a second aspect, there is a method of designing a tiltrotor aircraft, comprising the step of modularizing a lift propulsion system, wherein the lift propulsion system is configured to be connected to at least two different fuselages.

In another aspect, there is a tiltrotor aircraft including a fuselage; and a lift propulsion module described herein, the lift propulsion module including a mounting surface; wherein the lift propulsion module is coupled to the fuselage on the mounting surface.

In a third aspect, there is a method of assembling a tiltrotor aircraft including providing a lift propulsion module; providing a fuselage; and connecting the lift propulsion module to the fuselage; wherein the lift propulsion module is configured to be physically interchangeable with different types of fuselages.

In a fourth aspect, there is a system including a lift propulsion module; and a plurality of interchangeable fuselages, each of the plurality of interchangeable fuselages is configured to physically interchangeable with the lift propulsion module.

Other aspects, features, and advantages will become apparent from the following detailed description when taken in conjunction with the accompanying drawings, which are a part of this disclosure and which illustrate, by way of example, principles of the inventions disclosed.

DESCRIPTION OF THE DRAWINGS

The novel features believed characteristic of the embodiments of the present disclosure are set forth in the appended claims. However, the embodiments themselves, as well as a preferred mode of use, and further objectives and advantages thereof, will best be understood by reference to the following detailed description when read in conjunction with the accompanying drawings, wherein:

DESCRIPTION OF THE PREFERRED EMBODIMENT

Figure 1A:
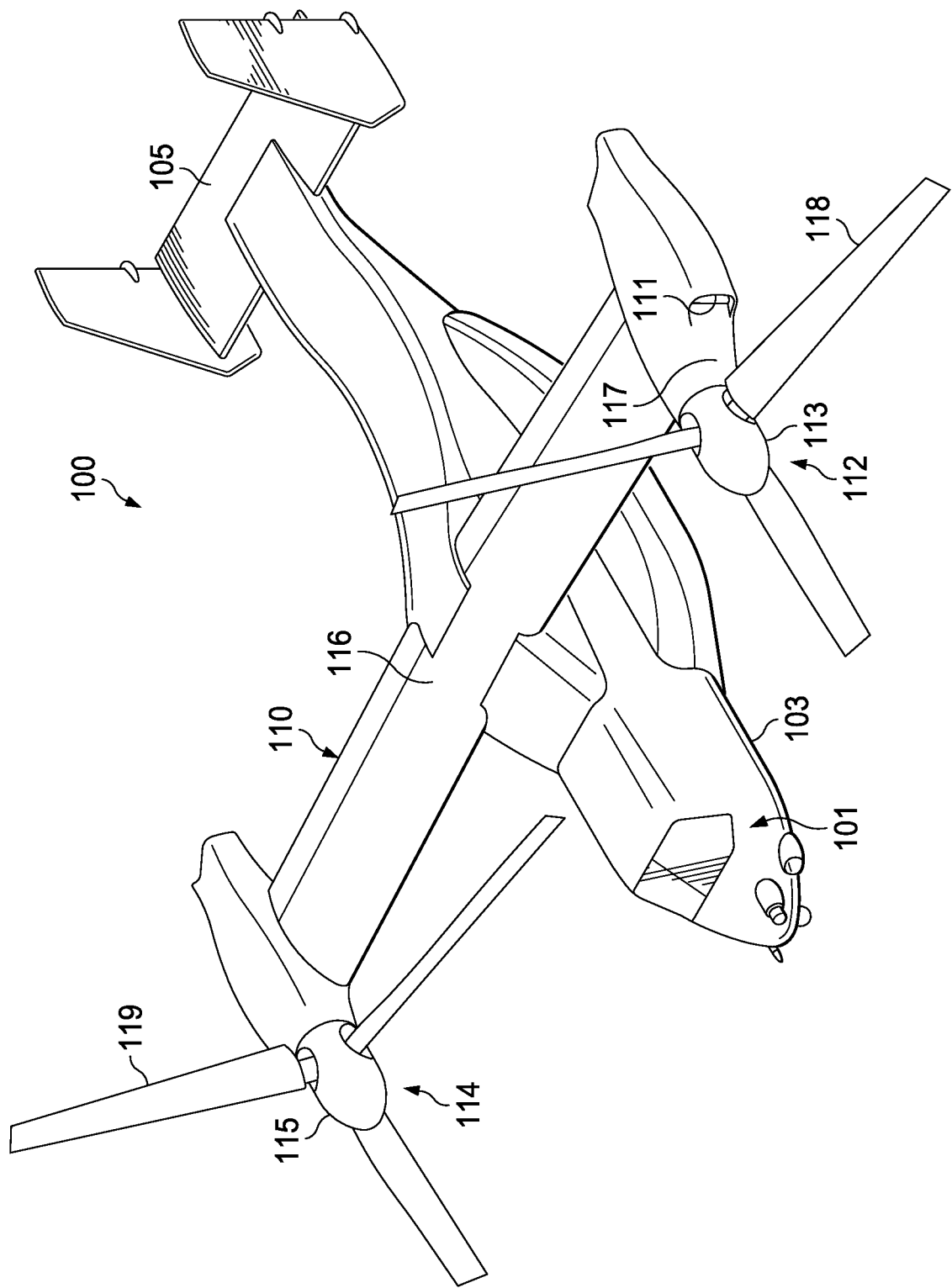
FIG. 1A is a perspective view of a tiltrotor aircraft with the proprotor assemblies in airplane mode, according to an embodiment.

Illustrative embodiments of the methods and systems for facilitating the design and manufacture of a tiltrotor aircraft using a lift propulsion module are described below. In the interest of clarity, all features of an actual implementation may not be described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Referring to FIGS. 1A-1D, an example tiltrotor aircraft 100 is illustrated. The tiltrotor aircraft 100 includes a fuselage 101 and a lift propulsion module 110. The fuselage 101 includes a main body section 103 and a tail member 105.

The lift propulsion module 110 includes a first rotor system 112, a second rotor system 114, and a wing member 116. The first rotor system 112 is located on an end portion of a first side of the wing member 116, while second rotor system 114 is located an end portion of a second side of the wing member 116. The first rotor system 112 and second rotor system 114 are substantially symmetric of each other about the fuselage 101. The first rotor system 112 and the second rotor system 114 each include a plurality of rotor blades 118 and 119 coupled to a rotor hub assembly 113 and 115, respectively. In the interest of clarity, only the first rotor system 112 will be discussed in detail in the following description. However, it should be understood that the form and function of the second rotor system 114 can be fully understood from the description of the first rotor system 112 described herein.

Figure 1B:
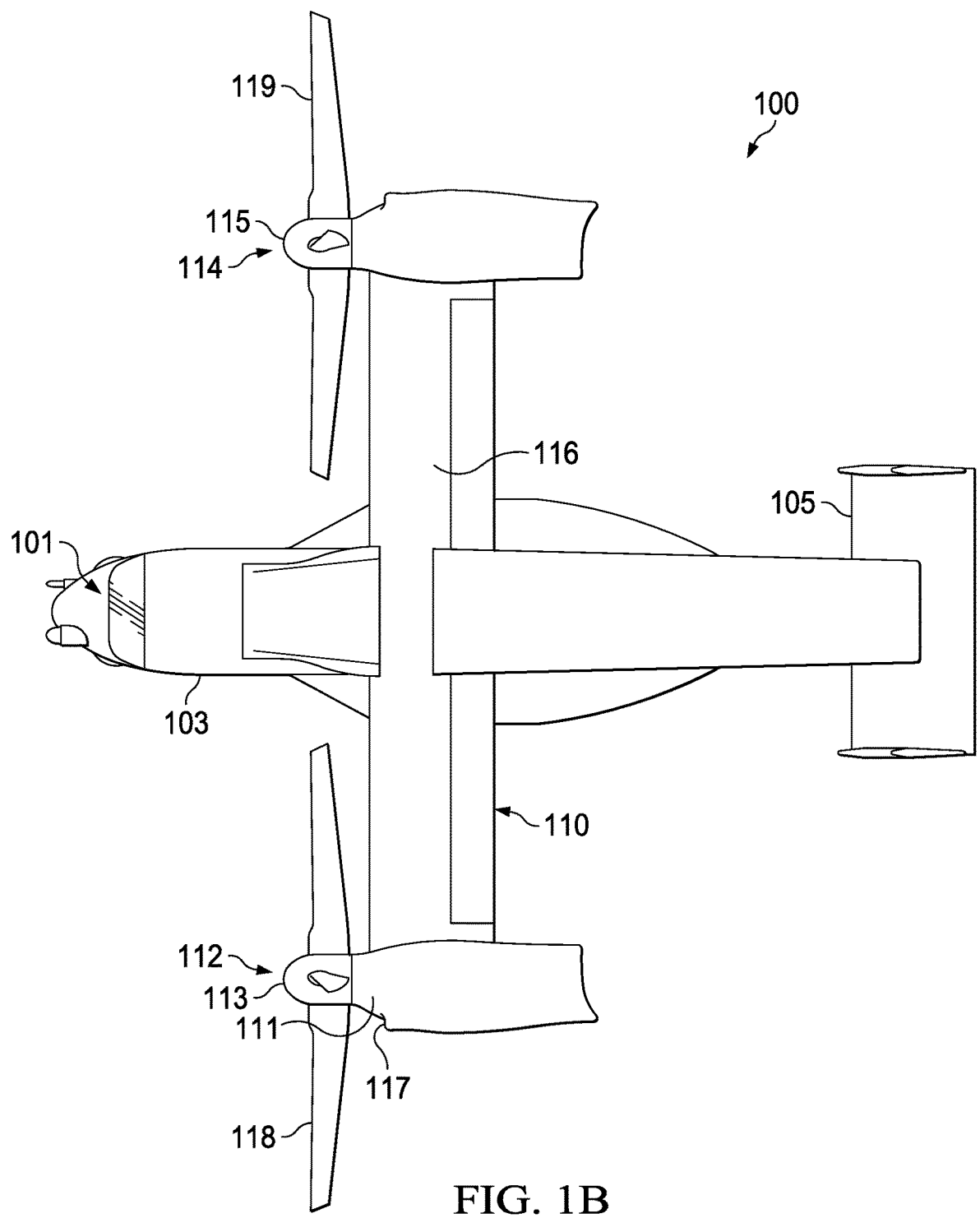
FIG. 1B is a plan view of the tiltrotor aircraft in FIG. 1A, according to an embodiment.
Figure 1C:
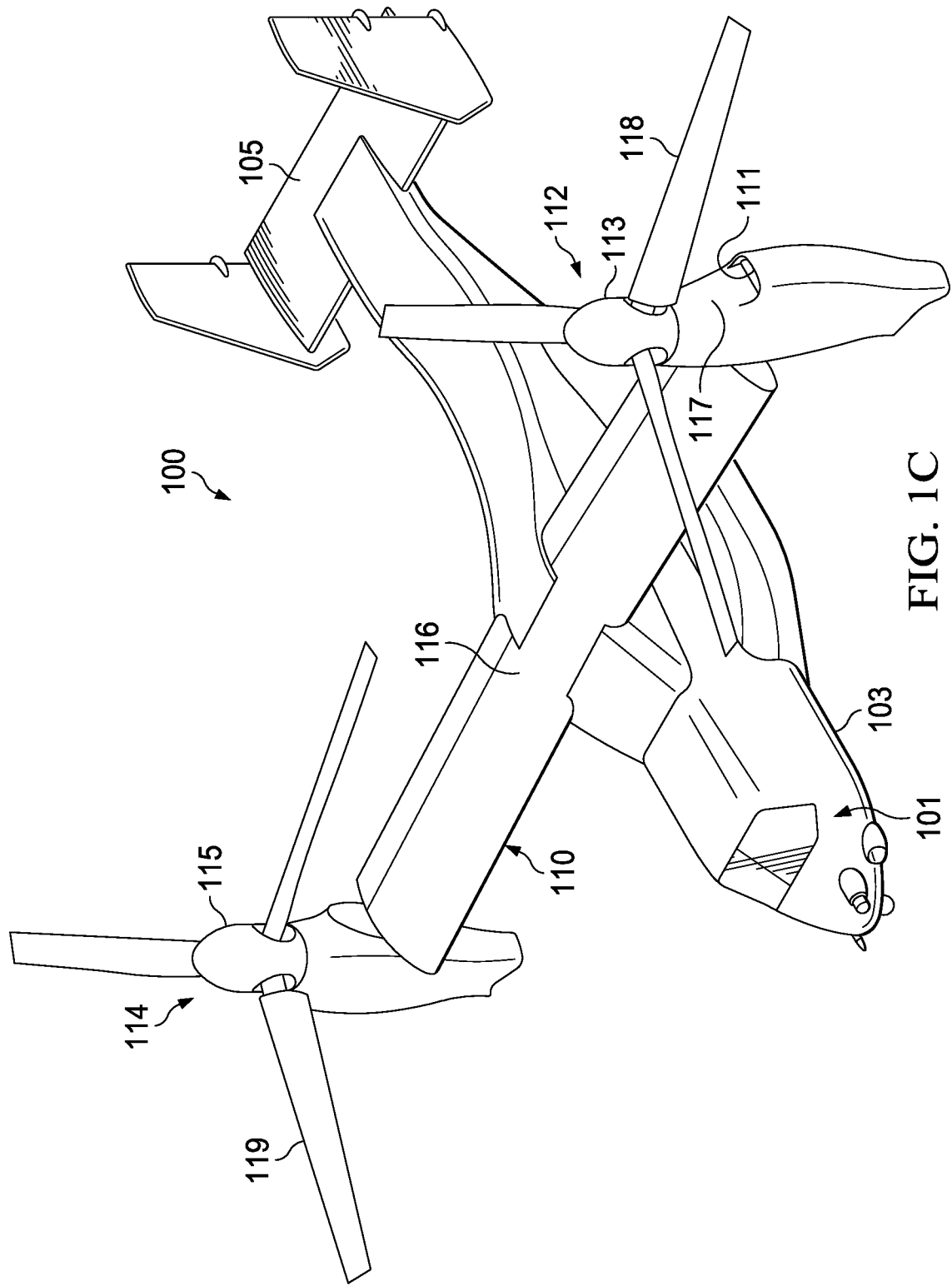
FIG. 1C is a perspective view of the proprotor assemblies in helicopter mode, according to an embodiment.
Figure 1D:
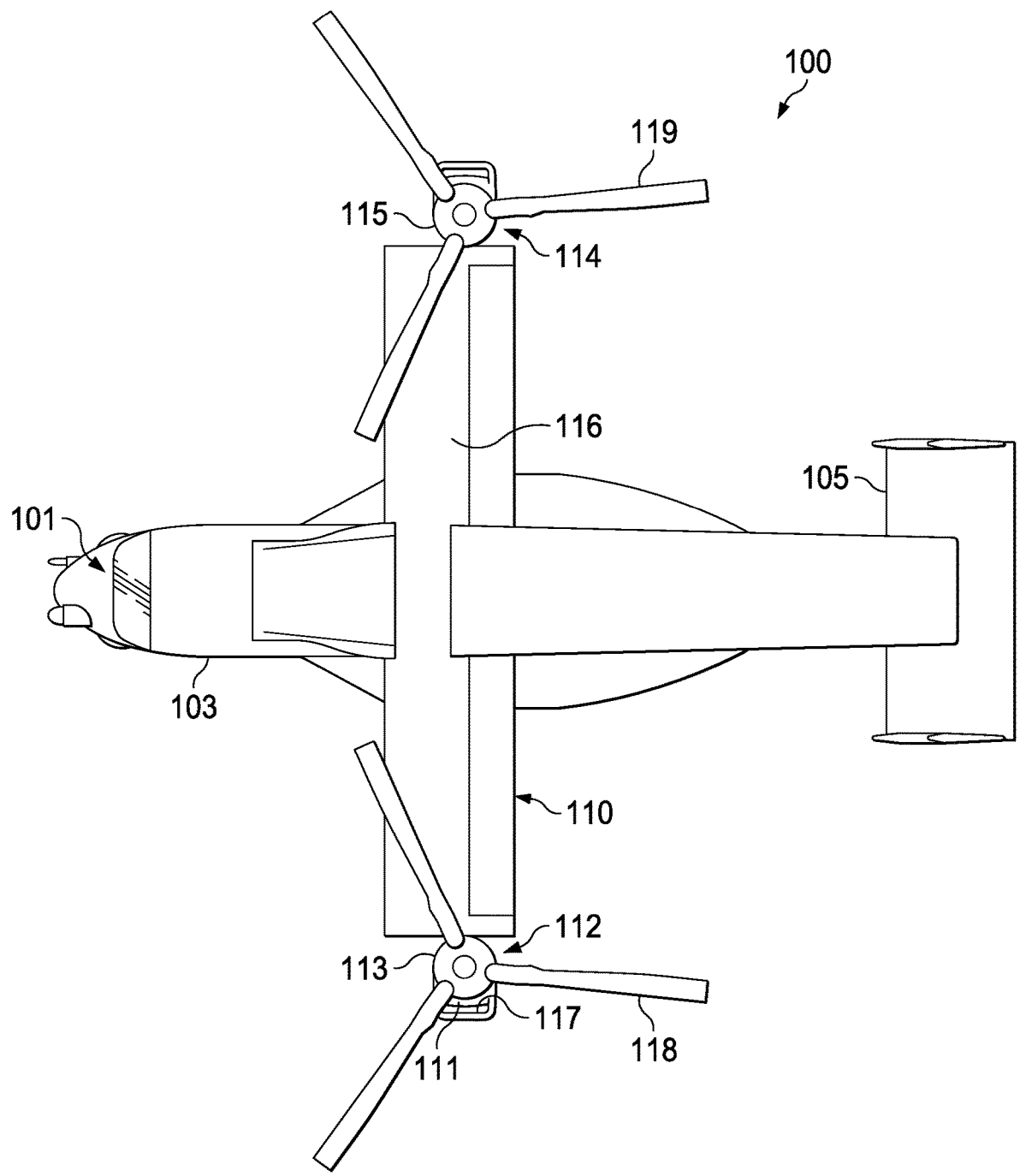
FIG. 1D is a plan view of the tiltrotor aircraft in FIG. 1C, according to an embodiment.

The first rotor system 112 includes a proprotor assembly 117 located at an outboard position on the wing member 116. The proprotor assembly 117 includes an engine disposed therein with an air intake 111. Proprotor assembly 117 is rotatable between the airplane mode, in which proprotor assembly 117 is positioned approximately horizontal (as shown in FIGS. 1A and 1B), and a helicopter mode (as shown in FIGS. 1C and 1D), in which proprotor assembly 117 is positioned approximately vertical. In the airplane mode, vertical lift is primarily supplied by the airfoil profile of wing member 116, while the rotor blades 118 in the proprotor assembly 117 provide forward thrust. In the helicopter mode, vertical lift and forward thrust is primarily supplied by the thrust of the rotor blades 118 in the proprotor assembly 117. It should be appreciated that the tiltrotor aircraft 100 can be operated such that proprotor assembly 117 is selectively positioned at any position between the airplane mode and helicopter mode, which can be referred to as a conversion mode.

Figure 2A:
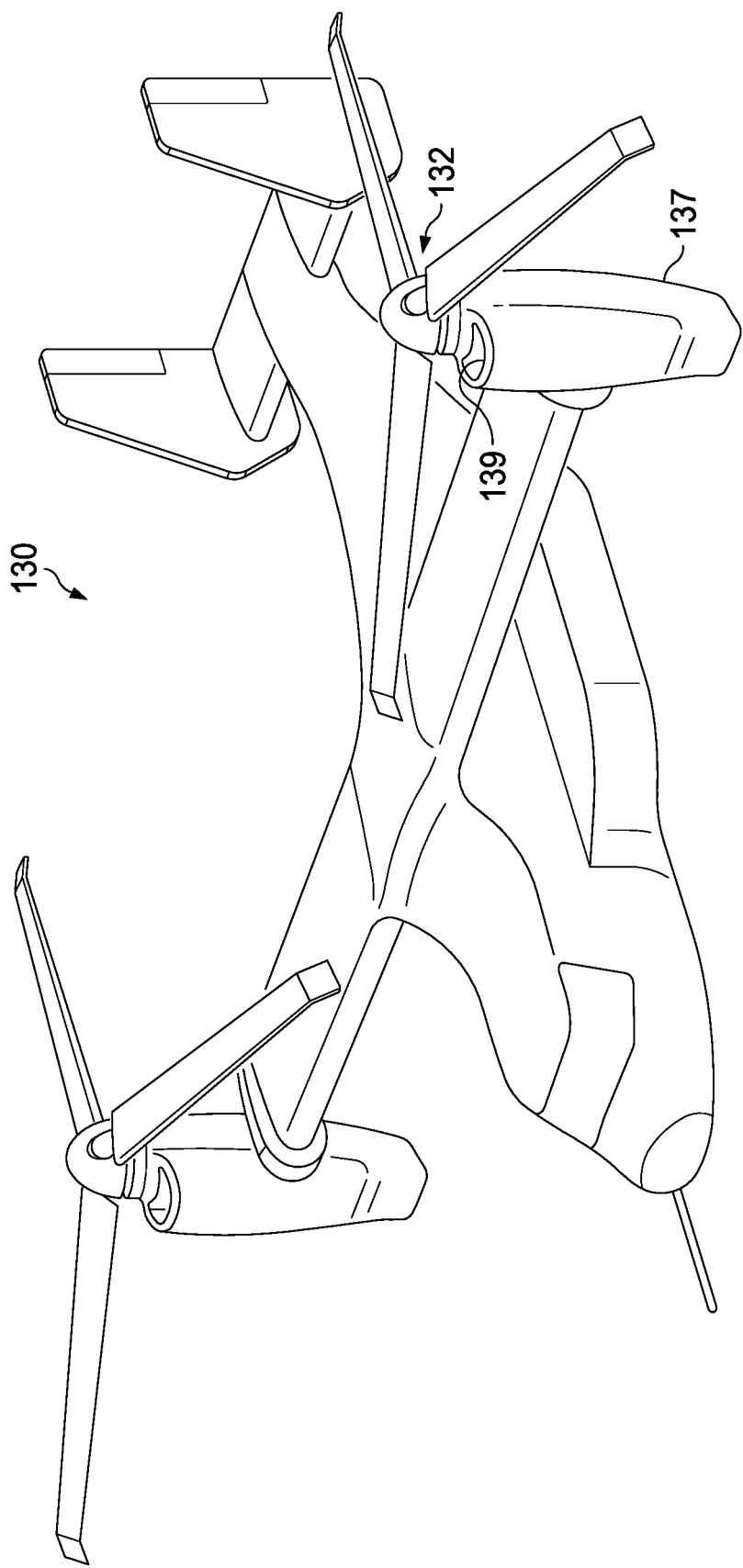
FIG. 2A is a perspective view of a tiltrotor aircraft with the proprotor assemblies in helicopter mode, according to an embodiment.
Figure 2B:
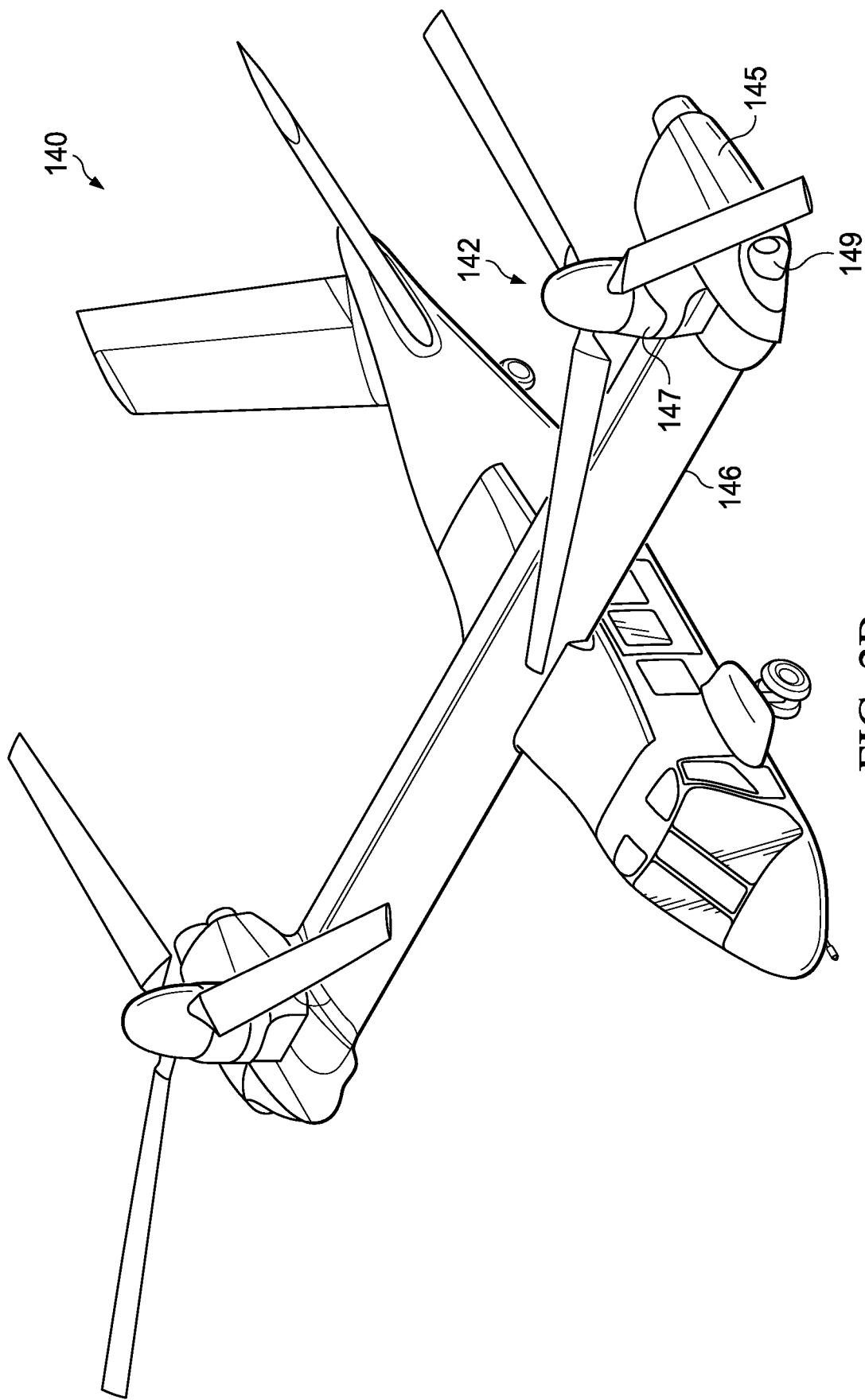
FIG. 2B is a perspective view of a tiltrotor aircraft with the proprotor assemblies in helicopter mode, according to an embodiment.

FIGS. 2A-2B illustrate other examples of tiltrotor aircraft 130, 140, respectively. Tiltrotor aircraft 130, 140 are substantially similar to tiltrotor aircraft 101, except as noted herein. Tiltrotor aircraft 130 is another example of a configuration of a first rotor system 132 including a proprotor assembly 137 with an engine disposed therein. Proprotor assembly 137 is rotatable between airplane and helicopter modes. Proprotor assembly 137, which is in helicopter mode in FIG. 2A, incudes an air intake 139 on a bottom surface thereof.

Referring now to FIG. 2B, tiltrotor aircraft 140 is an example of a configuration of a first rotor assembly 142 including a proprotor assembly 147 and a fixed engine portion 145. Proprotor assembly 147 is rotatable between a helicopter mode, shown in FIG. 2B, and an airplane mode, while the fixed engine portion 145 remains in-plane with the wing 146. Fixed engine portion includes an engine and an air intake 149.

Figure 3A:
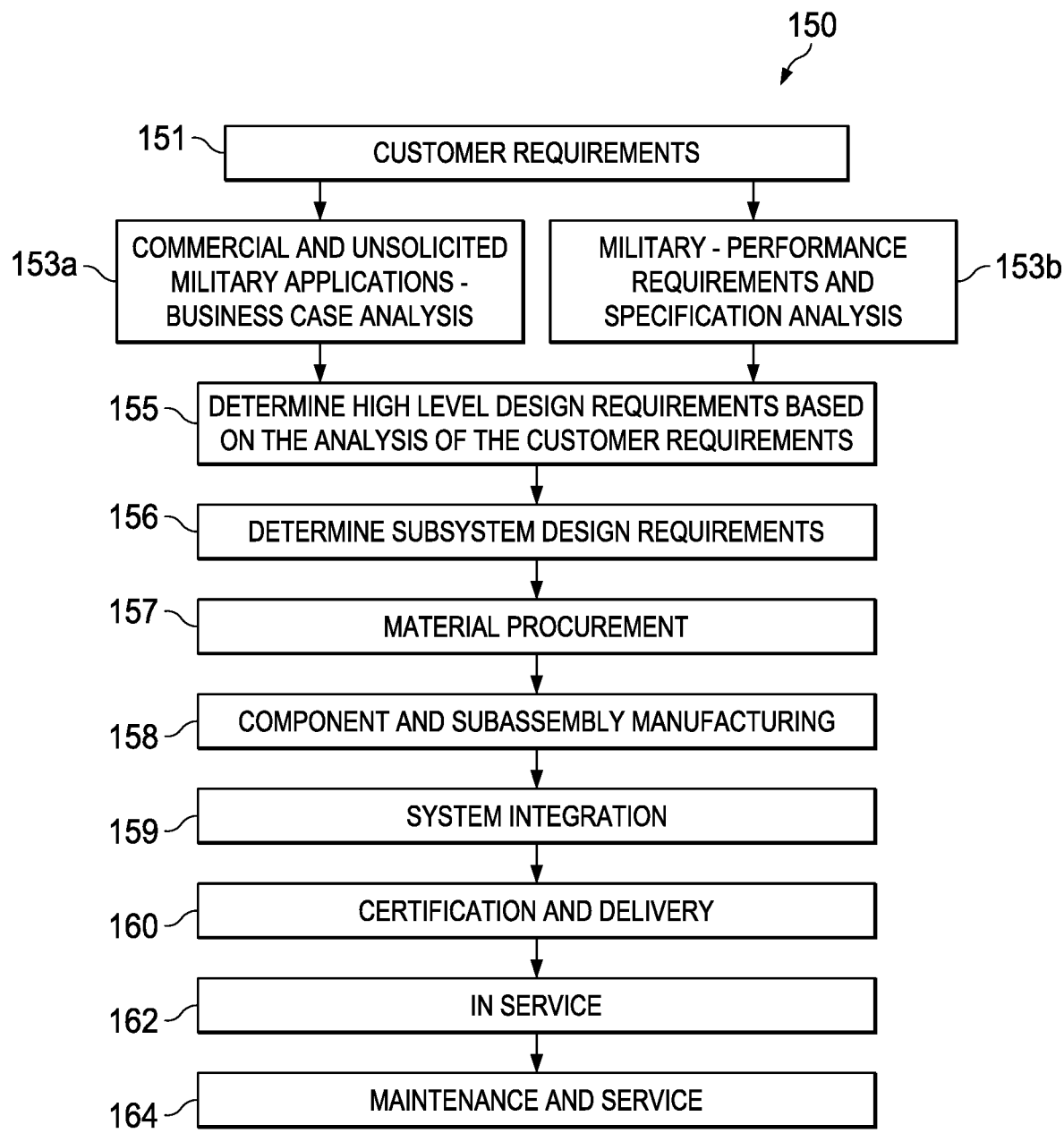
FIG. 3A is a simplified block diagram of a typical prior art design and manufacturing process used to produce a tiltrotor aircraft.
Figure 3B:
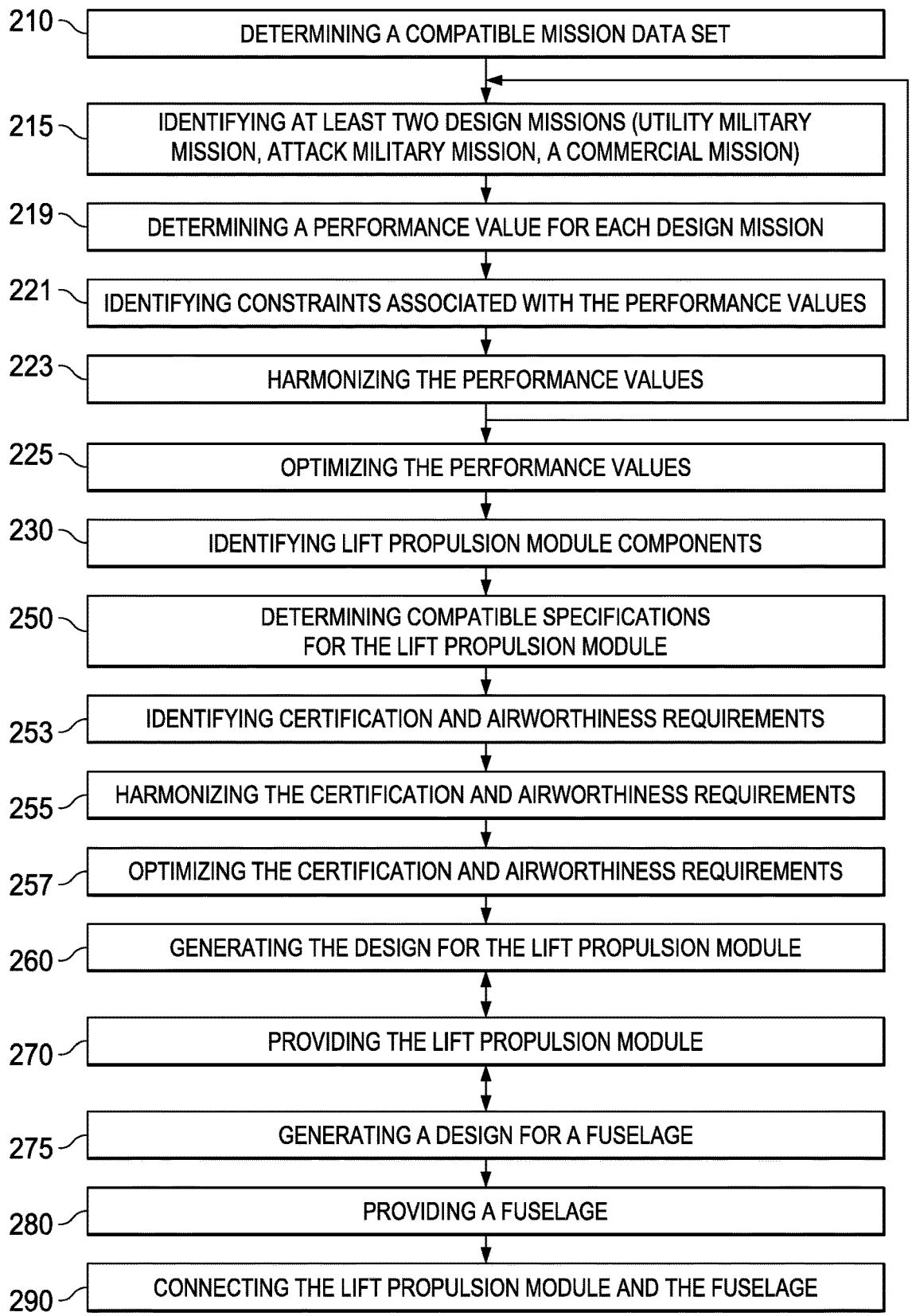
FIG. 3B illustrates exemplary steps for designing a tiltrotor aircraft, according to an embodiment.
Figure 3C:
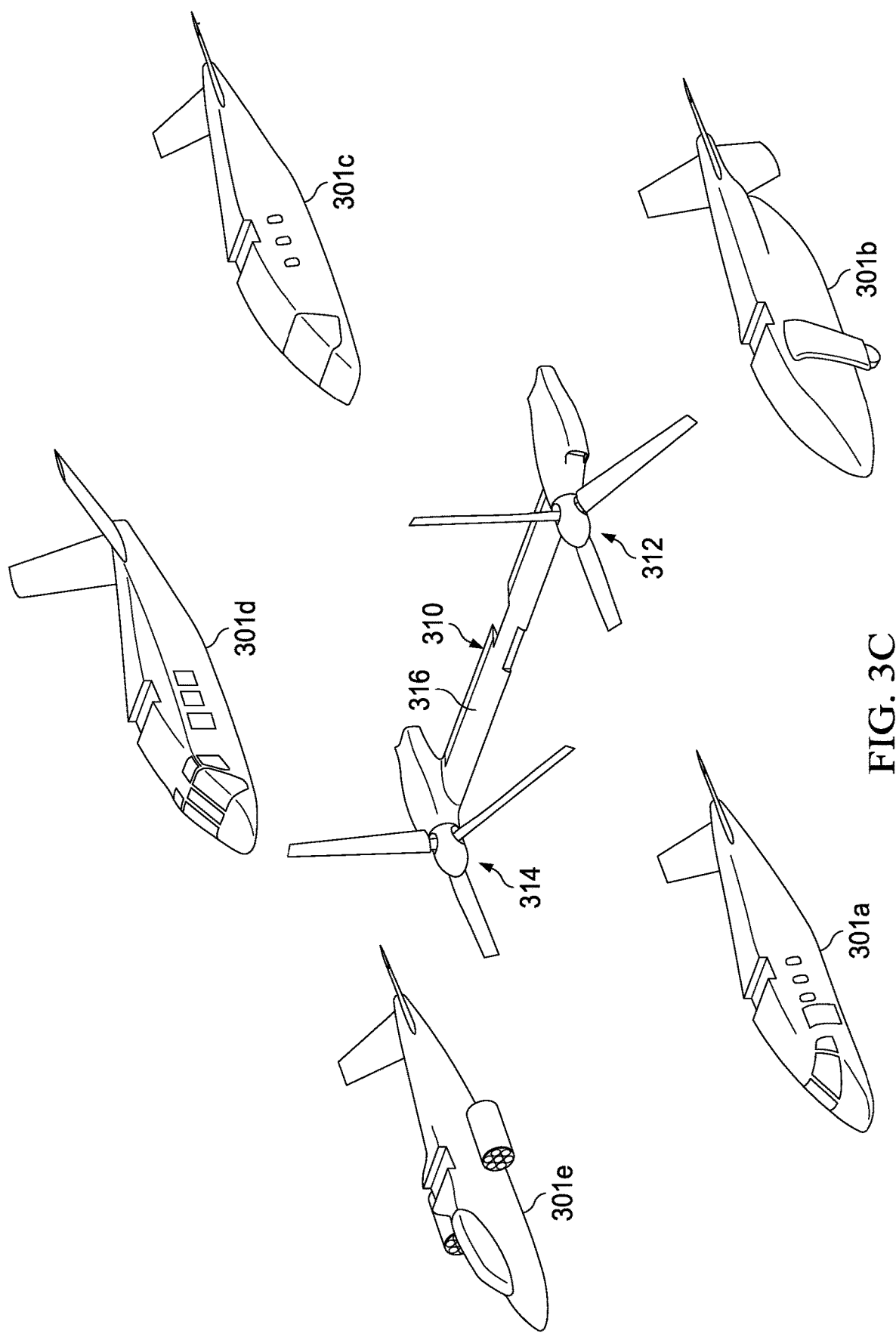
FIG. 3C is a perspective view of a lift propulsion module and different fuselages, according to an exemplary embodiment.
Figure 3D:
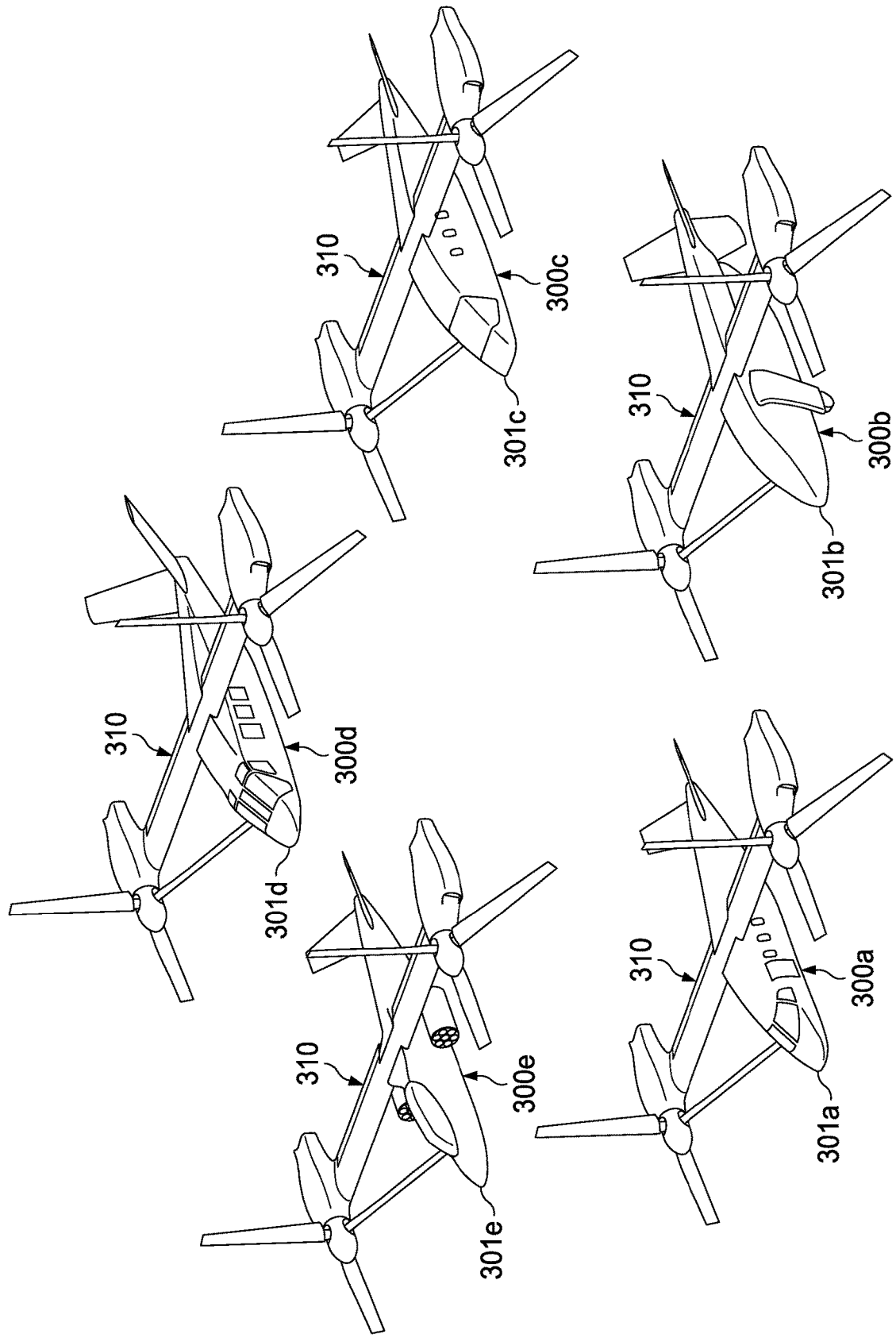
FIG. 3D is a perspective view of assembled tiltrotor aircraft in FIG. 3C, according to an embodiment.

FIGS. 3B-3D illustrate methods for facilitating designing and manufacturing of a lift propulsion module for a tiltrotor aircraft that overrides the routine and conventional sequence of events illustrated in FIG. 3A. Method 200, shown in FIG. 3B, includes determining a compatible mission data set in step 210, identifying the lift propulsion module components for the compatible mission data set in step 230, determining the specifications for the lift propulsion module in step 250, and generating a design for a lift propulsion module in step 260. In some embodiments, the method 200 includes the step 270 of manufacturing the lift propulsion module, the step 280 of manufacturing a fuselage, and the step 290 of connecting the lift propulsion module and the fuselage to manufacture a tiltrotor aircraft. The lift propulsion module designed and manufactured according to method 200 is configured to be mated or otherwise connected to at least two different fuselages as shown in FIGS. 3C-3D.

In an embodiment, at least one of the steps of determining a compatible mission data set 210, identifying the lift propulsion module components 230, and determining compatible specifications for the lift propulsion module 250 can be considered modularizing a lift propulsion system, which can be configured to be connected to at least two different fuselages.

The step 210 of determining a compatible mission data set in step 210 can include step 215 of identifying at least two design missions. The design missions can include a utility military mission, an attack military mission, and a commercial mission. In an embodiment, the at least two design mission are different (e.g., a utility military mission and an attack military mission, a utility military mission and a commercial mission, an attack military mission and a commercial mission). In some embodiments, the design missions can include a manned aircraft mission, an unmanned aircraft mission, a remote controllable mission, an autonomous mission, a semi-autonomous mission, or any combinations thereof. In some embodiments the design mission could include an army aircraft with no shipboard storage requirements and a marine aircraft which must stow below the deck of the aircraft. In some other embodiments, the design missions can include personal aircraft mission, a hobby aircraft mission, a toy aircraft mission, a functional replica mission, or any combination thereof.

The step 210 of determining a compatible mission data set can include step 219 of determining a performance value for each design mission. The performance value can include at least one of the following: speed, range, payload, loiter time, hover requirements such as hover out of ground effect ("HOGE") capability, and aircraft weight. In an exemplary embodiment, the performance values for a utility military mission can include payload, range, and HOGE. For example, and not limitation, a utility military mission could be determined that requires carrying 4000 lbs of troops for payload, having a cruise range of about 300 nm radius, a vertical takeoff and landing at 6K/95 HOGE (e.g., a pressure altitude of 6,000 feet and an ambient temperature of 95 degrees), and an aircraft weight of 27,000 lbs. In another exemplary embodiment, the performance values for an attack military mission can include payload, speed, range, loiter time, and HOGE. For example, and not limitation, an attack military mission could be determined to have the following performance values of carrying 3000 lbs. of missiles, cruise radius including escort utility aircraft at greater than 300 kts to 300 nm radius, loiter time for 1 hour, and takeoff and landing at 4k/95 HOGE. In an exemplary embodiment of a commercial mission, the performance values can include payload, range, and HOGE. For example, and not limitation, a commercial mission can be determined to have the following performance values of carrying 3000 lbs. of passengers, a 225 nm cruise radius, and a SL/103 F Category A HOGE landing on an oil platform.

The step 210 of determining a compatible mission data set can include step 221 of identifying constraints associated with the performance requirements. A lift propulsion module designed to meet commercial requirements may have different constraints as compared to a lift propulsion module designed to meet military requirements. In an exemplary commercial embodiment, the constraints can be cost, weight, hover requirements, range requirements, loiter requirements, payload requirements, speed requirements, reliability requirements, producibility requirements, passenger comfort and safety requirements. In an exemplary military embodiment, the constraints can include the commercial constraints but can have different weighting or targeted goals and can include survivability elements including vulnerability, crashworthiness, signature, and armament requirements.

In an exemplary embodiment, a utility military mission and attack military can have different constraints. An illustrative embodiment based on the performance values for the utility military mission, attack mission, and commercial mission described in the previous paragraph, the constraints would be the following: 6K/95 HOGE, 4000 lbs. payload, aircraft weight of 27,000 lbs., cruise radius of 300 nm, cruise radius of 225 nm, 3000 lbs. of payload, and Category A HOGE landing on oil platform, which requires a single engine landing capability.

The step 210 of determining a compatible mission data set can include step 223 of harmonizing the performance requirements. The harmonizing step 223 can include identifying common performance requirements. In some embodiments, the harmonizing step 223 can include identifying the lowest or highest performance requirement among the design missions and selecting the lowest or highest performance requirement to generate harmonized performance requirements. In an embodiment, the performance requirements are harmonized by prioritizing a ranking or weighting of the performance requirements. For instance, if the performance requirement is a cruise range and the first data point is 300 nm radius for the utility military mission, 300 nm radius for the attack military mission, and 225 nm radius for the commercial mission, then the cruise performance requirement could be harmonized to the furthest (e.g., highest) radius of 300 nm. The harmonizing step 223 can include identifying the lowest or highest constraints from step 221. If the performance requirements are too far apart for harmonization, a design mission may be removed and a new one may be identified in step 217.

The step 210 of determining a compatible mission data set can include step 225 of optimizing the performance values to generate a compatible mission data set. The optimization of the performance values in step 225 can include modifying various aspects of the performance requirements and/or harmonized performance values to improve or reduce performance for a design mission and to eliminate or reduce a problem or other shortcoming for a design mission, or to achieve a business target arrangement.

In some embodiments, the optimizing step 225 can include prioritizing the performance values according to a prioritization scheme. An example of a prioritization scheme for a commercial mission can rank requirements by range and payload being the most important to hover and altitude performance being less important. An example of a military design mission prioritization scheme can rank requirements by 6K/95 hover performance and cruise speed being the most important to passenger comfort being less important. The levels of ranking can be based on expected military or commercial customer usage along with other production, performance, and maintenance related factors, such as, but not limited to, capability, weight, shared spares, reduced manufacturing costs. In one embodiment, the resulting prioritized value capability might value the utility military mission as a higher priority with the attack military mission only being partially compliant to the attack military mission performance values. In an embodiment, the prioritized value capability can prioritize payload, hover, and cruise segments higher than loiter capability.

Identifying lift propulsion module components can be achieved based on the compatible mission data set in step 230. The lift propulsion module components can include the rotor systems, wing member, mounting surface, and operational systems therefor. In an embodiment, the identifying lift propulsion module components can include generating a mounting surface for the wing member based on the compatible mission data set. The mounting surface of the wing member can be configured to be connected with at least two different fuselages. In an embodiment, the rotor size and configuration, wing size and configuration, transmission horsepower and configuration, engine horsepower and fuel consumption, fuel quantities and tank configuration, and subsystem requirements and architecture (e.g., flight control, electrical, fire suppression, hydraulics, etc.) can be determined for the lift propulsion module components. In one embodiment, a 3D model of the lift propulsion module components is created. Step 230 can include testing by simulation models or in a flight test bench. In an embodiment, the lift propulsion module components can undergo FEA, aerodynamic, or other performance testing.

A step 250 can include determining compatible specifications for the lift propulsion module components. In an exemplary embodiment, the determining compatible specification step 250 can identify common specifications that can meet the most difficult military requirements and commercial requirements (if a commercial mission was selected).

The step 250 of determining compatible specifications for the lift propulsion module components can include step 253 of identifying certification and airworthiness requirements (e.g., airworthiness certifications, commercial certifications, military certifications, and others). One of the unique features of the method 200 is that step 250 determines compatible specifications that are based on a combination of at least two disparate design missions normally requiring different aircraft configurations, which involves additional steps and analysis as compared to the conventional method shown in FIG. 3A.

An exemplary airworthiness certification can be a standard airworthiness certification, a special airworthiness certification, and combinations thereof. MIL-HDBK-516C, DEPARTMENT OF DEFENSE HANDBOOK: AIRWORTHINESS CERTIFICATION CRITERIA is an exemplary airworthiness certificate that specifies many criteria for areas including systems engineering, structures, flight technology, propulsion, air vehicle subsystems, crew systems, diagnostics, avionics, electrical, etc. An exemplary airworthiness requirement for flight technology is MIL-HDBK-516C 6.1.1.1 entitled Determining operational missions and having the following Criterion: Verify that the operational mission requirements of the air vehicle system have been determined and adequately defined for which safety of flight is to be assured.

In an illustrative embodiment, a commercial certification can be 14 CFR Part 25, 14 CFR Part 27, 14 CFR Part 29, 14 CFR Part 33, TR additions, 609 Certification Basis ("the 609 Cert"), tiltrotor regulations, and combinations thereof. The 609 Cert includes fixed wing and rotorcraft elements and tiltrotor specific certification elements. As a result, the certification document for the 609 and likely future commercial tiltrotors references select Part 25 fixed wing requirements and Part 29 rotorcraft requirements but also in addition tiltrotor unique requirement (TR) not currently referenced in the Federal Aviation Regulations (FAR). Tiltrotor regulations can include future regulations and certifications relevant to tiltrotor aircraft. In some embodiments, identifying the relevant certification and airworthiness requirements in step 253 can include unique requirements not listed in the FAR, which are typically more extensive for a tiltrotor aircraft. Current airworthiness standards relevant to commercial missions can include: Part 23—Airworthiness Standards: Normal, Utility, Acrobatic and Commuter Airplanes; Part 25—Airworthiness Standards: Transport Category Airplanes; Part 27—Airworthiness Standards: Normal Category Rotorcraft; Part 29—Airworthiness Standards: Transport Category Rotorcraft; and Part 33—Airworthiness Standards: Aircraft Engines. Commercial certifications and airworthiness requirements tend to center on additional safety measures or margin compared to military use. In an exemplary embodiment, aisle spacing is specified to insure egress.

Commercial Certification Example

14 CFR 25.815—Width of aisle. The passenger aisle width at any point between seats must equal or exceed the values in the following table:

| Passenger seating capacity | Minimum passenger aisle width (inches) | |
|---|---|---|
| | Less than 25 in. from floor | 25 in. and more from floor |
| 10 or less | 12 | 15 |
| 11 through 19 | 12 | 20 |
| 20 or more | 15 | 20 |

In an illustrative embodiment, a military certification can be a MIL-HDBK-516 certification from the Department of Defense Handbook, an ADS-51-HDBK certification from the Aeronautical Design Standard Handbook, an AMCP 706-203 certification from the Engineering Design Handbook, a custom specification such as SD-572 for the V-22, an AR-56 Army Marine Certification, military regulations, and combinations thereof. Military regulations can include future military regulations and certifications relevant to military tiltrotor aircraft. Specifications unique for military certification can include crashworthiness, ballistic, fire suppression, and navigation and communication requirements. For example, MIL_HDBK-516C 17.1.1 Gun/rocket induced environments is a military certification requirement related to ballistic requirements that has a criterion to verify that environment induced by gun/rocket operation is compatible with the air vehicle's limitations for muzzle blast and overpressure, recoil, vibroacoustics, cooling, egress, human factors, and loads of the air vehicle.

Once the airworthiness requirement, the commercial requirement, and the military requirements are determined in step 253, the certification and airworthiness requirements can be harmonized in step 255 and optimized in step 257. The harmonizing step 253 can include identifying common certification and airworthiness requirements. In some embodiments, the harmonizing step 253 can include identifying the lowest or highest certification and airworthiness requirements and selecting the lowest or highest certification and airworthiness requirements to generate harmonized certification and airworthiness requirements. In an embodiment, the certification and airworthiness requirements are harmonized by prioritizing a ranking or weighting of the certification and airworthiness requirements. In an exemplary embodiment involving fuel tank design, military certifications require ballistic test, and drop test within a wing structure at a specified speed of impact. While the commercial requirement allows a drop test without structure at a slower speed. Harmonized requirements can include the military requirement with analysis and evidence demonstrating the worst condition. In an alternate harmonized requirements embodiment, testing using both the military and commercial requirements may be needed to meet FAA and Military Test Requirements.

Optimizing the certification and airworthiness requirements occurs in step 257 to generate optimized certification and airworthiness requirements. Step 257 can include modifying various aspects of the harmonized certification and airworthiness requirements based on at least one of regulation, supplementary analysis evaluating separate requirements, and discussions with regulatory agencies.

Method 200 includes step 260 of generating the design for a lift propulsion module. In an embodiment, the compatible mission data set, the lift propulsion module components, and optimized certification and airworthiness requirements are evaluated to generate the design for the lift propulsion module. The step 260 can include further evaluation by a model simulation, a bench test, and/or an in-flight test. In an embodiment, the design for a lift propulsion module can be optimized, which can involve further analysis, structural or aerodynamic analysis, or other performance testing. Further business evaluation can identify the best value design for the lift propulsion module.

In embodiment, one or more steps of the method 200 can occur on a computer. A program that analyzes aircraft performance including aerodynamics, weights, and aircraft size parameters iterates to determine an optimized lift propulsion module design for at least two design missions.

Method 200 can include the step 270 of providing the lift propulsion module. In a particular embodiment, the step 270 of providing the lift propulsion module can include manufacturing the lift propulsion module. In an embodiment, the lift propulsion module is premade or manufactured separately from the fuselage prior to connection with the fuselage.

Method 200 can include generating a design for a fuselage in step 275. Step 275 can include identifying more than one type of fuselage designs for disparate design missions and tailoring the more than one type of fuselage design to the lift propulsion module. For example, the military fuselage design can include an attack fuselage, a utility fuselage, an unmanned aerial vehicle fuselage, and/or a fuselage configured for shipboard wing and rotor stow that could be connected with a common lift propulsion module. In some embodiments, the fuselage design is at least one of the following: a pressurized passenger cabin, an unpressurized passenger cabin, a cargo fuselage, a military fuselage, an unmanned aerial vehicle fuselage, and a military fuselage configured for shipboard wing and rotor stow. In an embodiment, the cargo fuselage includes an unpressurized cargo cabin with large cargo doors.

In an exemplary embodiment of more than one type of military fuselage design the military fuselage designs can include an army aircraft with no shipboard storage and a marine aircraft which must stow below the deck of the aircraft. For shipboard storage, the military fuselage design could include a wing pivot mechanism or similar mechanism as described in U.S. Pat. Nos. 5,337,974 and 4,691,878, both of which are hereby incorporated by reference.

In some embodiments, the generating a design for a fuselage in step 275 can include conceptual design and scoping of likely fuselage configurations during the design development of the lift propulsion system. The final design of the individual fuselages can then be determined as market and customer desires dictate and/or as a group of fuselages having various designs that can be connected with the lift propulsion module. Additional fuselage design options can be added if they fit within the attachment interface and lift propulsion capabilities of the lift propulsion module.

Method 200 can include the step 280 of providing a fuselage. In a particular embodiment, the step 280 of providing a fuselage can include manufacturing the fuselage. In an embodiment, the fuselage is premade or manufactured separately from the lift propulsion module prior to connection with the lift propulsion module. Method 200 can include the step 290 of connecting the lift propulsion module and the fuselage to form a tiltrotor aircraft as described herein.

A unique feature of the method 200 includes the lift propulsion module having wing and rotor components that are common across a plurality of disparate design missions normally requiring unique aircraft. FIGS. 3C-3D illustrate an exemplary embodiment of a lift propulsion module 310 including a first rotor system 312, a second rotor system 314, and a wing member 316 that is configured for connection with at least five different fuselages. In the exemplary embodiment, five different fuselages 301a-301e are shown that can be mated or otherwise connected with the lift propulsion module 310. FIG. 3C-3D are illustrative of a system including a lift propulsion module 310 and a plurality of interchangeable fuselages 301a-301e. Each of the interchangeable fuselages 301a-301e can be configured to physically interchangeable with the lift propulsion module 310. Lift propulsion module 310 can be configured to be interchangeable with the different types of fuselages 301a-301e. For example, commercial fuselage 301a can be a cargo fuselage and connected with the lift propulsion module 310 to form a commercial tiltrotor aircraft 300a. Unmanned aerial vehicle (UAV) fuselage 301b is connected with the lift propulsion module 310 to form an unmanned aerial tiltrotor aircraft 300b. Fuselages 301c, 301d, 301e are examples of military fuselages that can be used for combat and/or utility type missions. A combat fuselage 301c is connected to lift propulsion module 310 to form the military combat tiltrotor aircraft 300c. A military utility fuselage 301d can be a cargo fuselage and used for transporting gear or personnel and is connected to the lift propulsion module 310 to form the military utility tiltrotor aircraft 300d. A tandem attack fuselage 301e is connected to lift propulsion module 310 to form the tandem attack tiltrotor aircraft 300e. In an embodiment, the fuselage can include a pressurized cabin, for example, but not limitation, to accommodate personnel or passengers. In another embodiment, the fuselage can include an unpressurized cabin, for example, but not limitation, to carry cargo or equipment. The lift propulsion module 310 reduces engineering costs and production time since the configuration of the lift propulsion module 310 can be used for the multiple tiltrotor aircraft.

In an embodiment, a tiltrotor aircraft 300 is manufactured by providing a lift propulsion module 310 and tailoring a fuselage 301 to a specification, a military operation, a commercial operation, a particular customer request, and combinations thereof.

Figure 3E:
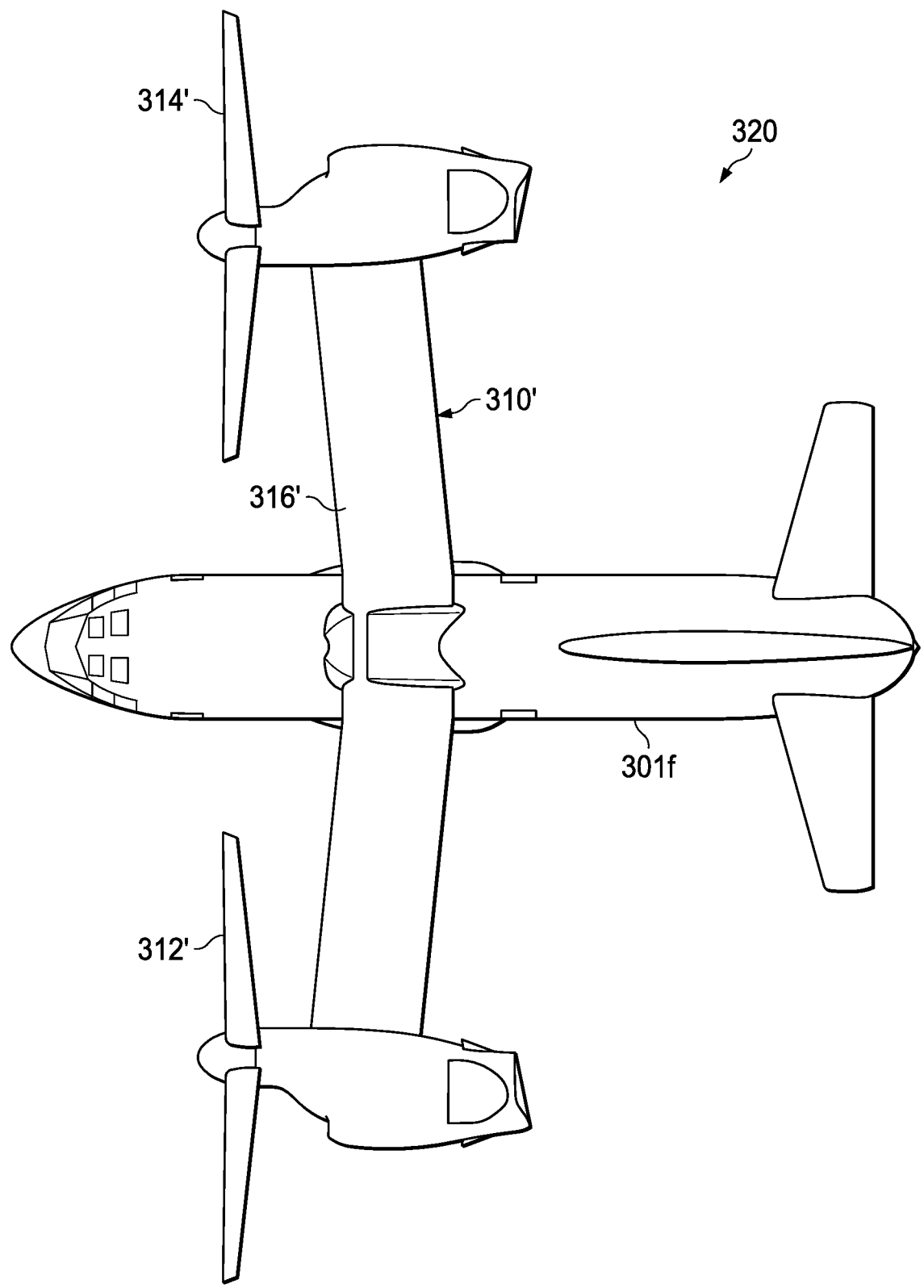
FIG. 3E is a top view of an assembled tiltrotor aircraft including a lift propulsion module in airplane mode, according to an exemplary embodiment.
Figure 3F:
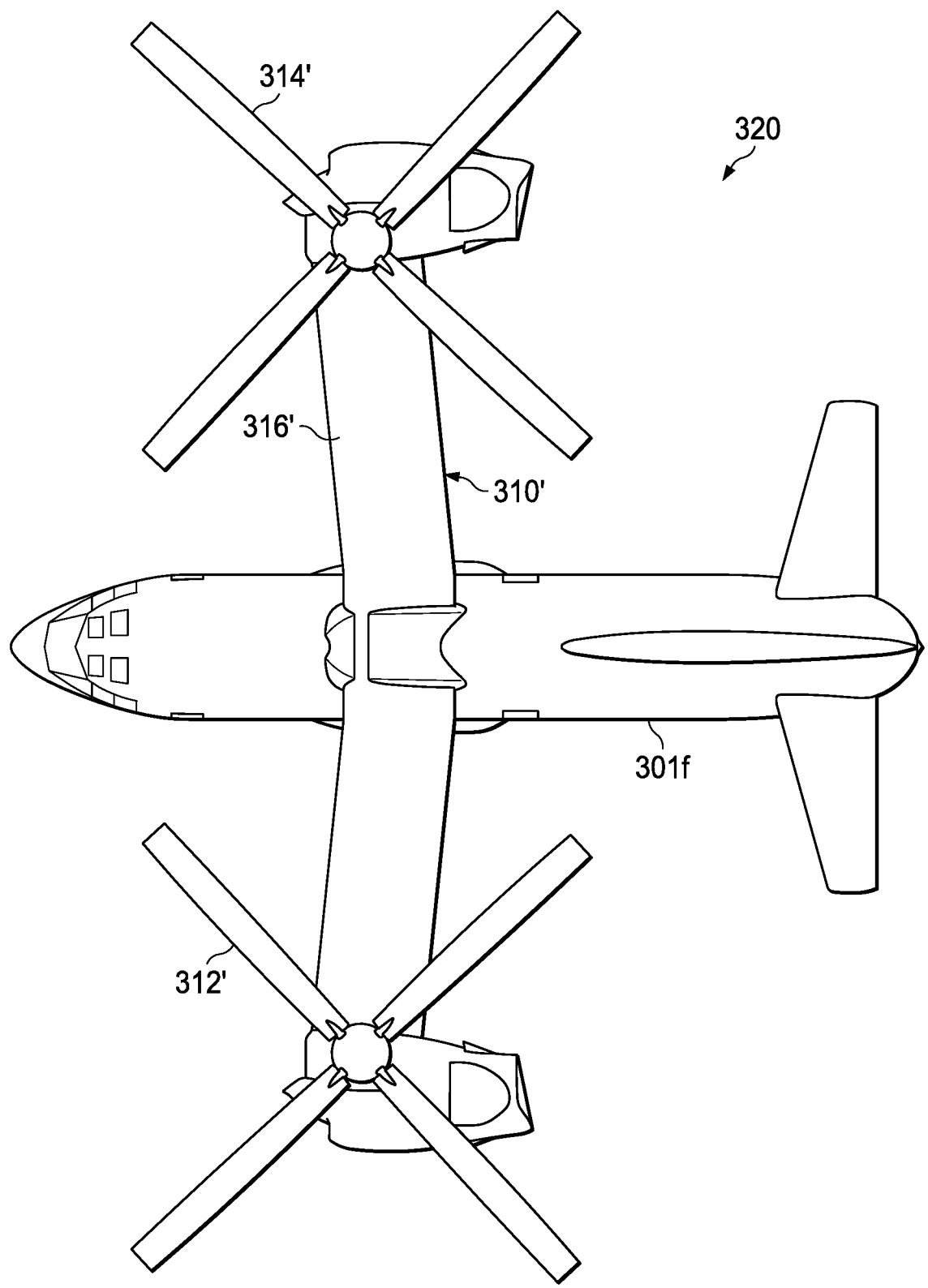
FIG. 3F is a top view of the assembled tiltrotor aircraft in FIG. 3E in helicopter mode, according to an exemplary embodiment.
Figure 3G:
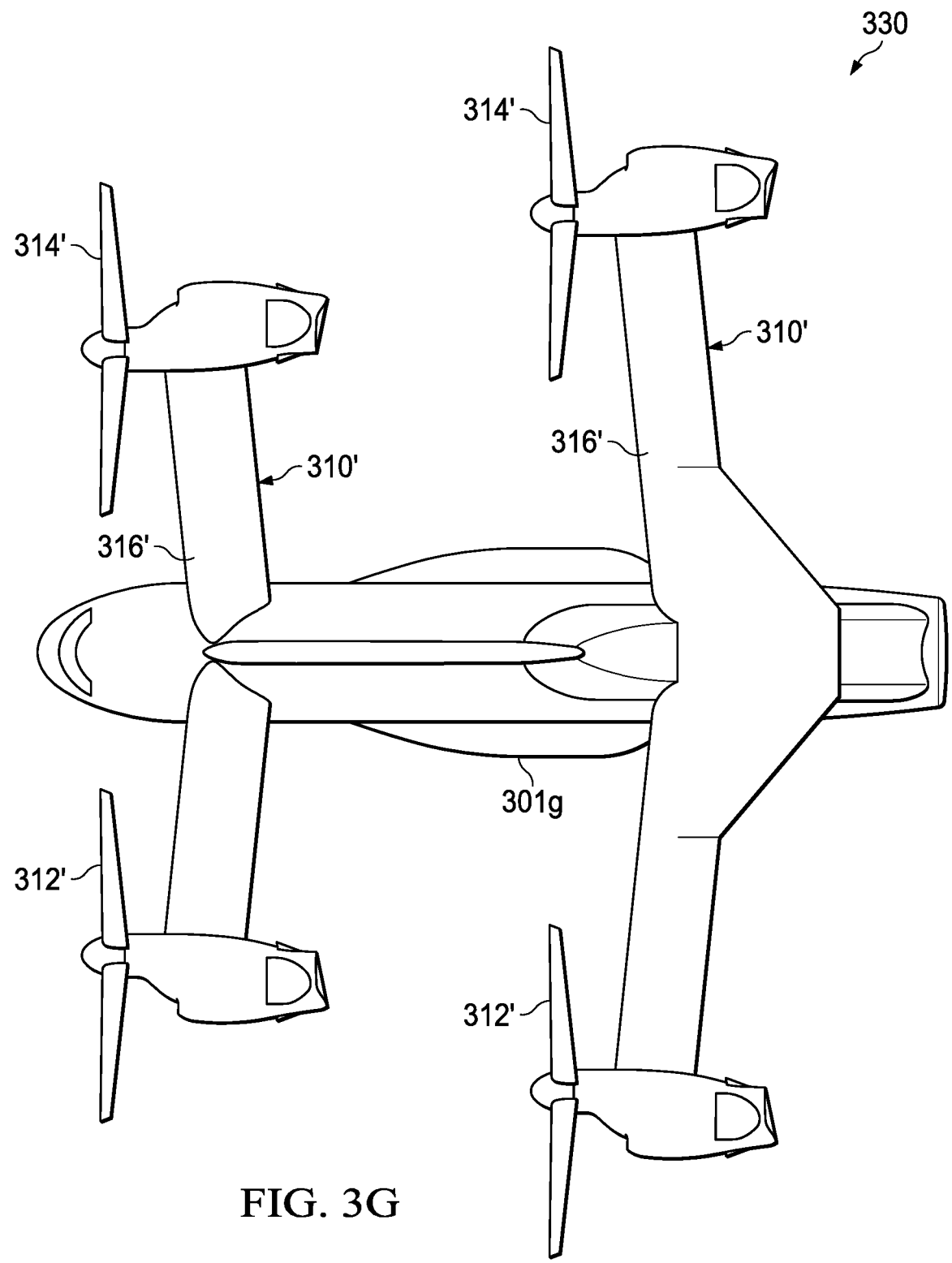
FIG. 3G is a top view of an assembled tiltrotor aircraft including a plurality of lift propulsion modules in airplane mode, according to an exemplary embodiment.
Figure 3H:
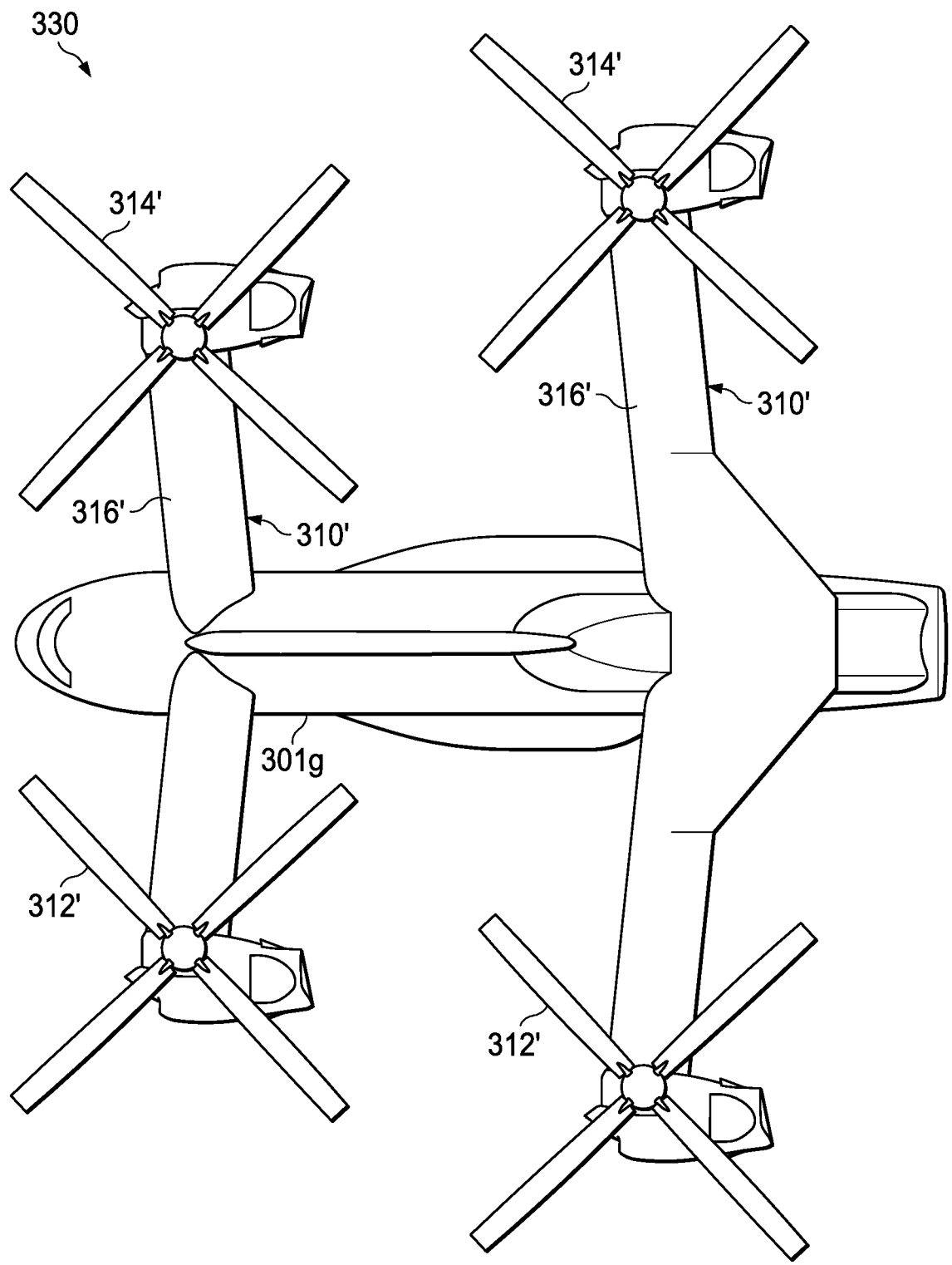
FIG. 3H is a top view of the assembled tiltrotor aircraft in FIG. 3G with the lift propulsion modules in helicopter mode, according to an exemplary embodiment.

While FIGS. 1A-1B, 2A-2B, and 3C-3D illustrate the fuselage 101, 301a-301e and the lift propulsion module 110, 310 in the context of a tiltrotor aircraft 100, 300a-300e, it should be understood that the lift propulsion module 110, 310 can be implemented on other tiltrotor aircraft. For example, an alternative embodiment can include a quad tiltrotor aircraft 330, as shown in FIGS. 3G-H. FIGS. 3E-3F illustrate an exemplary aircraft 320 with a lift propulsion module 310' and fuselage 301f. The rotor systems 312', 314' and wing member 316' of the lift propulsion module 310' can be used for the quad tilitrotor aircraft 330, shown in FIGS. 3G-3H. Quad tiltrotor aircraft 330 requires two lift propulsion modules 310', which if the wings 316' of the lift propulsion modules 310' were the same length would cause the forward wing and propwash to reduce the effectiveness of the aft wing. Accordingly, the length and width of the forward and aft wings 316' adjacent to the fuselage 301g can be tailored to avoid the forward wing 316' propwash and lengthen the aft wing for greater effectiveness.

In another example, the lift propulsion module 110, 310 can be used on a personal tiltrotor aircraft or other aircraft. Further, the lift propulsion module 110, 310 can configured for a variety of tiltrotor aircraft configurations.

FIGS. 4A-4B and 5A-5B illustrate an exemplary lift propulsion module 410 that has components and internal systems that fit interchangeably with various fuselages used in commercial and/or military operations. Certain features of the lift propulsion module 410 are as described above and bear similar reference characters to the lift propulsion module 110, 310, but with a leading '4' rather than a leading '1' or '3'. The lift propulsion module 410 includes a first rotor system 412, a second rotor system 414, and a wing member 416.

The wing member 416 includes components that can be connected to different fuselage configurations. The wing member 416 can include a complete system or components for a structural system 440, a drive system 450, a fuel system 460, a power system 466, and a fire suppression system 472.

The structural system 440 for the wing member 416 includes a leading edge 440a, a trailing edge 440b, a port end 440c, and a starboard end 440d. The leading edge 440a can be formed from skins 442 which have been hardened against impacts. In an embodiment, the skins 442 can be manufactured from a metallic material and are configured to provide protection against bird strikes and impacts by other objects during operation of the tiltrotor aircraft.

The structural system 440 includes an upper airfoil surface 444a and lower airfoil surface 444b that form an airfoil assembly 445. The upper and lower airfoil surfaces 444a, 444b are supported by support members that can be disposed within the interior of the wing member 416. In an exemplary embodiment, embodiment, the upper and lower airfoil surfaces 444a and 444b are a contoured curved airfoil assembly 445. In an embodiment, the airfoil assembly 445 has a generally straight leading edge 440a. In other embodiments, the leading edge 440a of the airfoil assembly 445 is swept forward or aft. The structural system 440 can include flaps 447 or other conventional control surfaces disposed adjacent to the trailing edge 440b. In some embodiments, the airfoil assembly 445 extends outwardly from a central axis A and can extend upwardly or downwardly toward the port end 440c and the starboard end 440d. In still another embodiment, the structural system 440 of the wing member 440 can include two separate airfoil assemblies 445 that can be disposed on either side of one or more various fuselage structures.

The structural system 440 further includes at least one mounting surface 446 disposed between the port end 440c and starboard end 440d for physically connecting a fuselage thereto. In an exemplary embodiment, the mounting surface 446 is formed from a notch in the trailing edge 440b in the wing member 416 allowing direct connection of the wing aft spar to the fuselage. A second mounting surface 448 can be formed from a notch in the leading edge 440a in the wing member 416 allowing attachment between the wing forward spar and fuselage. The mounting surface 446 can be an open space in the wing member 416 or an area of at least sufficient dimension to accept at least two different fuselages for mating therewith. In other embodiments, the mounting surface 446 can be the upper or lower airfoil surface 444a, 444b for mating a fuselage therewith.

In one embodiment, the mounting surface 446 and the second mounting surface 448 are generally located in the middle of the wing member between the port and starboard ends 440c, 440d. In other embodiments, there may be more than one fuselage connected to the wing member 416. For example, there may be a passenger fuselage disposed on the port end 440c and a cargo fuselage on the starboard end 440d, each of the fuselages would require a mounting surface 446 on the wing member 416.

It should be understood that the size, shape, arrangement, and contour of the wing member 416 may be selectively altered to produce different performance characteristics. It will be appreciated that in some applications it may be desirable to form the structure system 440 to meet commercial or military applications, which may require additional material and/or support members. In an embodiment, the structure system 440 includes material treatments for commercial or military operations.

Figure 5B:
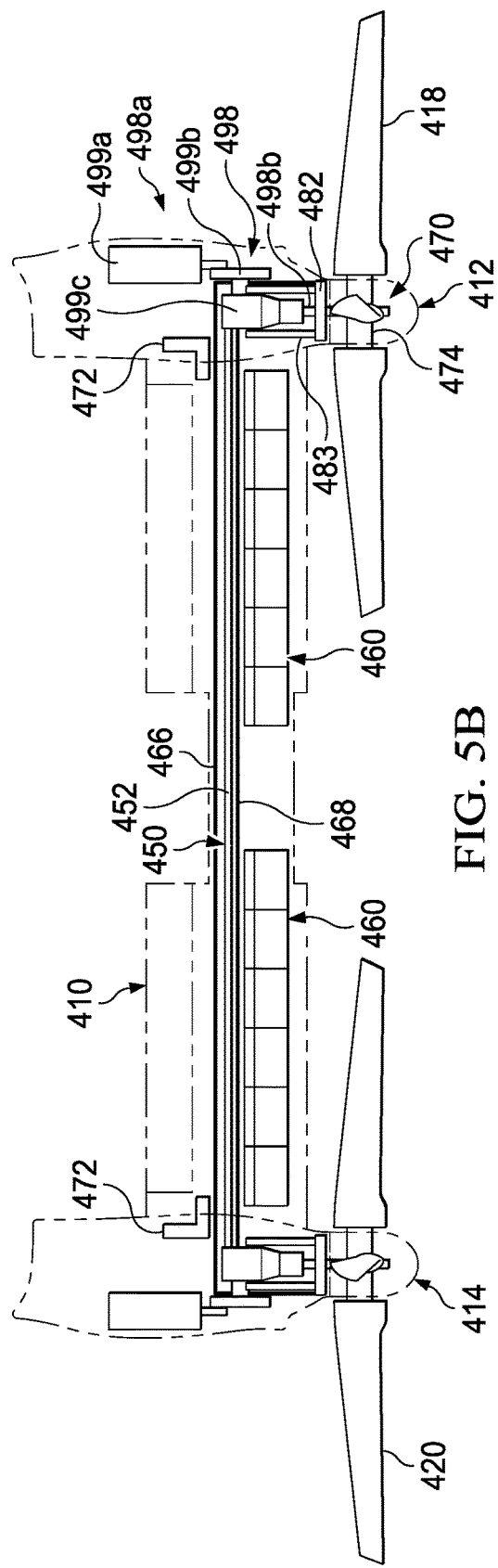
FIG. 5B is a top cut away view of a lift propulsion module, according to an embodiment.
Figure 5A:
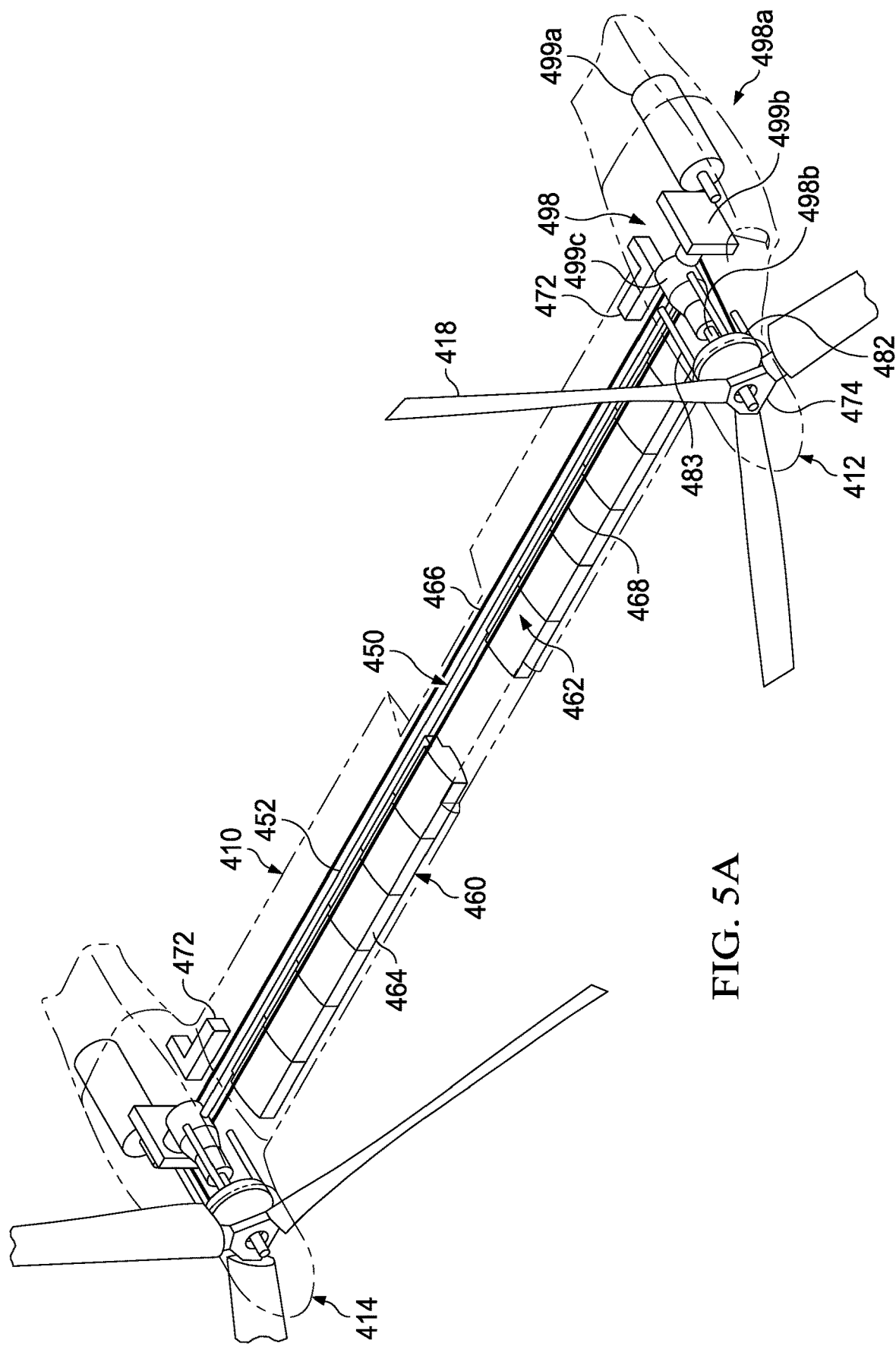
FIG. 5A is a perspective, cut away view of a lift propulsion module, according to an embodiment.

The drive system 450, the fuel system 460, the power system 466, and the fire suppression system 472 can be disposed within the wing member 416, as shown in FIGS. 5A and 5B. The drive system 450 includes a drive shaft 452 that extends across the wing member 416 to the first and second rotors 412, 414. The fuel system 460 includes fuel tanks 462, 464 on the port and starboard sides of the wing member 416. Each of the fuel tanks 462, 464 can include multiple connected reservoirs to store fuel therein. The fuel tanks 462, 464 can be integral with the housing of the wing member 416 or separate from the wing structure 416. In another embodiment, the fuel tanks 462, 464 are a plurality of fuel bags. Each of the fuel tanks 462, 464 includes at least one port to connect with a fuel line for providing fuel to the engines in the first and second rotor systems 412, 414. In an embodiment, the fuel system 460 is a commercial fuel system. In another embodiment, the fuel system 460 is a military fuel system. In some embodiments, the systems routing 466 can be an electric system, a hydraulic system, and systems for control and power of these systems, actuators and other systems and combinations thereof.

The first rotor system 412 is pivotably mounted on the port end 440c of the wing member 416. The second rotor system 414 is pivotably mounted on the starboard end 440d of the wing member 416. While illustrated as being located at the ends of the wing member 416, it should be appreciated that the ends of the wing member 416 can be lengthened to customize an aspect ratio of wing member 416 in accordance with implementation specific requirements (e.g., aerodynamic lift requirements). As such, it should be understood that even though the first and second rotor systems 412, 414 are illustrated approximately abutting the end of wing member 416, in some embodiments, the first and second rotor systems 412, 414 can include the end portions extending beyond the first and second rotor systems 412, 414.

FIGS. 5A-5B show a simplified example of the first rotor system 412 that may be incorporated in whole or in part in the lift propulsion module 410. The first rotor system 412 can include a complete system or components for a proprotor assembly 470, a pylon 480, and a nacelle 490. The proprotor assembly 470 can include a complete system or components for a plurality of rotors 418, an aerodynamic spinner fairing 471, a hub 474, and the power system 466. The pylon 480 can include a swashplate 482, a pylon structure 484, and the power system 466. The nacelle 490 can include a complete system or components for a nacelle structure 492, the power system 466, the fire suppression system 472, an air inlet 494, an exhaust 496, and the power train 498. Other components may be included in the first rotor system 412 but are not shown in FIGS. 5A-5B, for example, but not limitation, drive links, drive levers, and tilting devices.

The proprotor assembly 470 and pylon 480 are configured to rotate along with the nacelle 490 between vertical and horizontal positions. The plurality of rotor blades 418 coupled to the hub 474 disposed within the spinner fairing 471 can be operated and controlled using the swashplate 482 coupled to one or more actuators 483 to allow the proprotor assembly 470 to operate in airplane mode or helicopter mode. In an embodiment, the spinner fairing 471 and the plurality of rotor blades 418 are constructed of treated materials that have undergone treatments suitable for commercial and/or military operations. The swashplate 482 can be coupled to the rotor blades via a plurality of pitch links. The plurality of swashplate actuators 483 are configured to selectively actuate the swashplate 482, thereby selectively changing the pitch of the plurality of rotor blades 418 so as to affect thrust, lift and directions of the tiltrotor aircraft during operation.

The power train 498 includes a power source 498a and a drive shaft 498b for transmitting torque and/or rotation to the hub 474. In operation, drive shaft 498b receives torque or rotational energy from power source 498a. Rotation of the hub 474 causes the plurality of blades 418 to rotate about drive shaft 498b. In some embodiments, power train 498 may include more or fewer components. For example, in some embodiments, tilting devices may be provided in mechanical communication with power train 498 that allows certain components of the proprotor assembly 470 to tilt between helicopter mode and airplane mode.

The power source 498a in the power train 498 can include a variety of components, including an engine 499a and a transmission gearbox 499b. In one embodiment, the engine 499a is a Rolls-Royce T406 turboshaft engine. The inlet 494 provides an inlet point for air into the engine 499a and an exhaust outlet 496 allows the air and combustion products from the engine 499a to exit the nacelle structure 492. The drive shaft 452 is operably connected to the differentials 499c in gearboxes 499b in the first rotor system 412 and the second rotor system 414, so as to transfer power between the first and second rotor systems 412, 414.

Figure 4A:
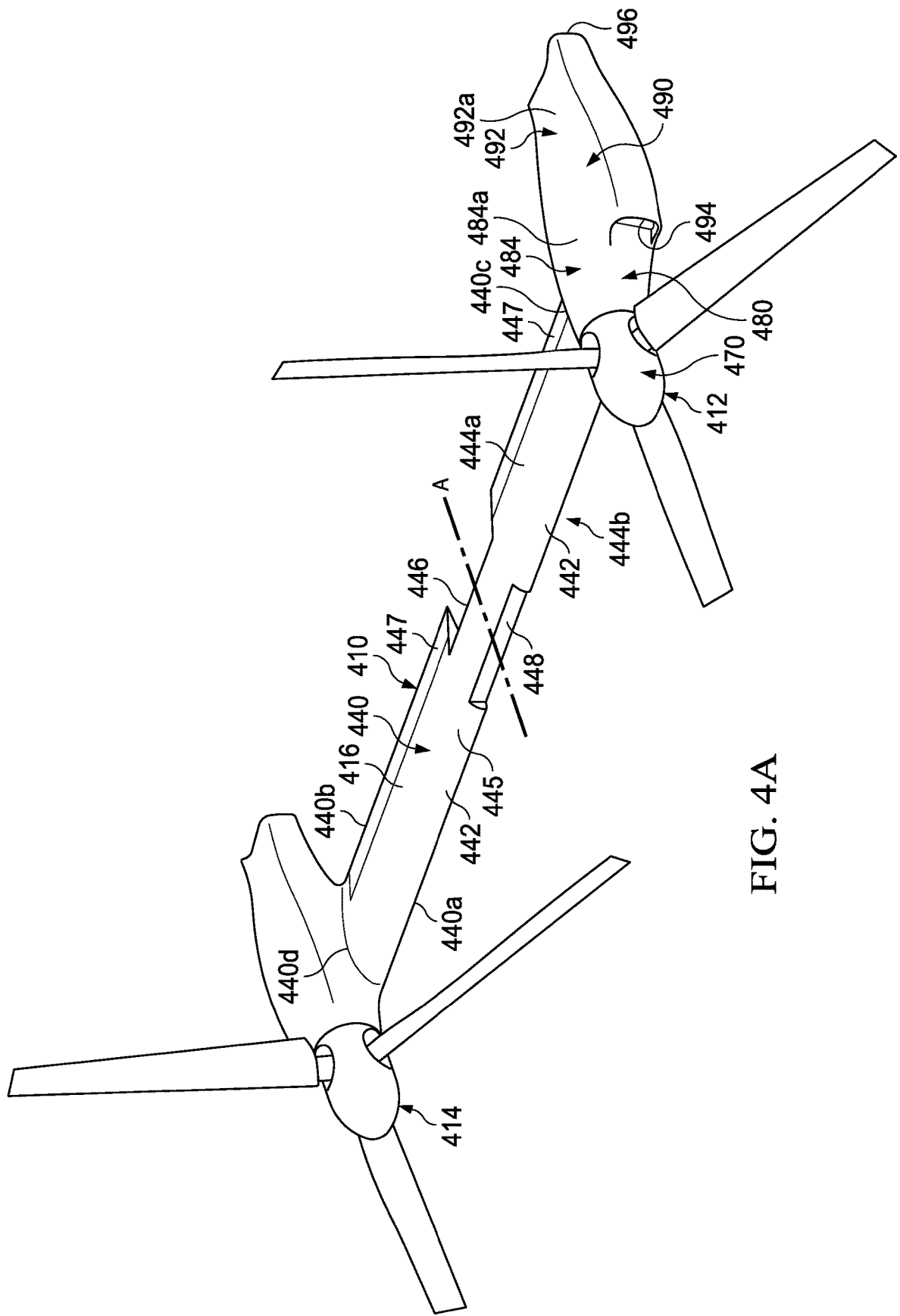
FIG. 4A is a perspective view of a tiltrotor lift propulsion module, according to an embodiment.
Figure 4B:
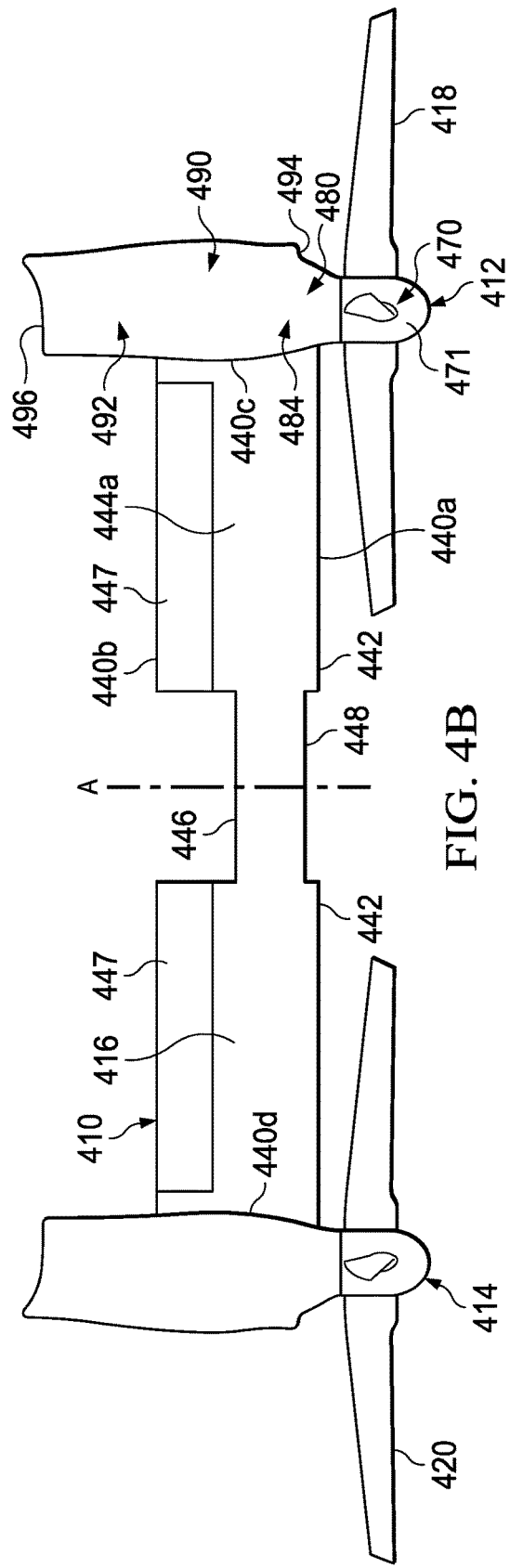
FIG. 4B is a top view of a tiltrotor lift propulsion module, according to an embodiment.

The pylon and nacelle structures 484, 492 include aerodynamic outer surfaces 484a, 492a, as shown in FIG. 4A, and internal support brackets to support and stabilize the components housed therein. The size, shape, length, arrangement, and contour of the pylon and nacelle structures 484, 492 may be selectively altered to achieve the desired performance for a commercial and/or military operations. In an embodiment, the nacelle structure 492 can include an infrared signature suppressor system for some military operations.

Figure 6A:
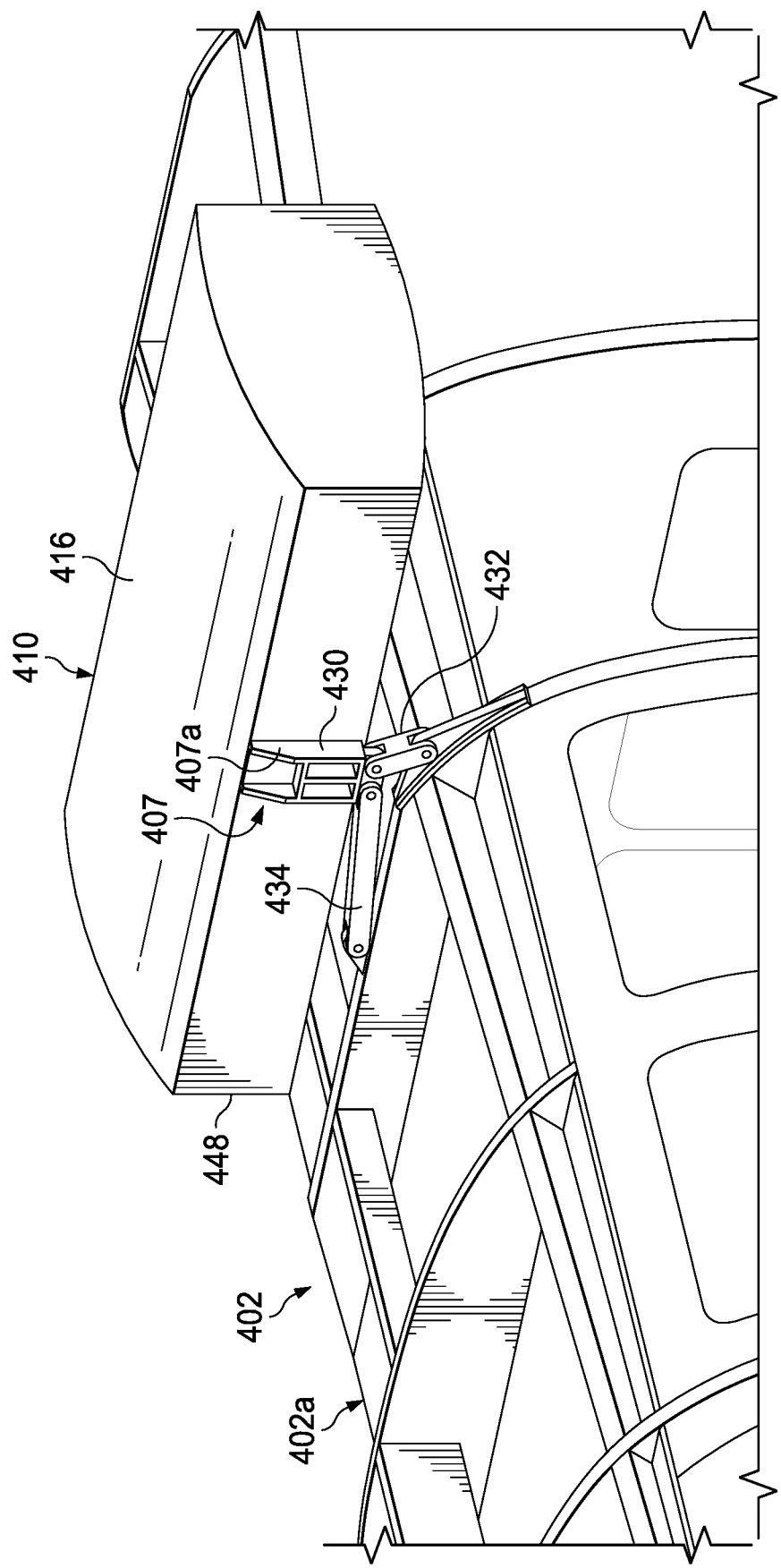
FIG. 6A is a perspective, partial cut away view of a forward wing mounting system, according to an embodiment.
Figure 6B:
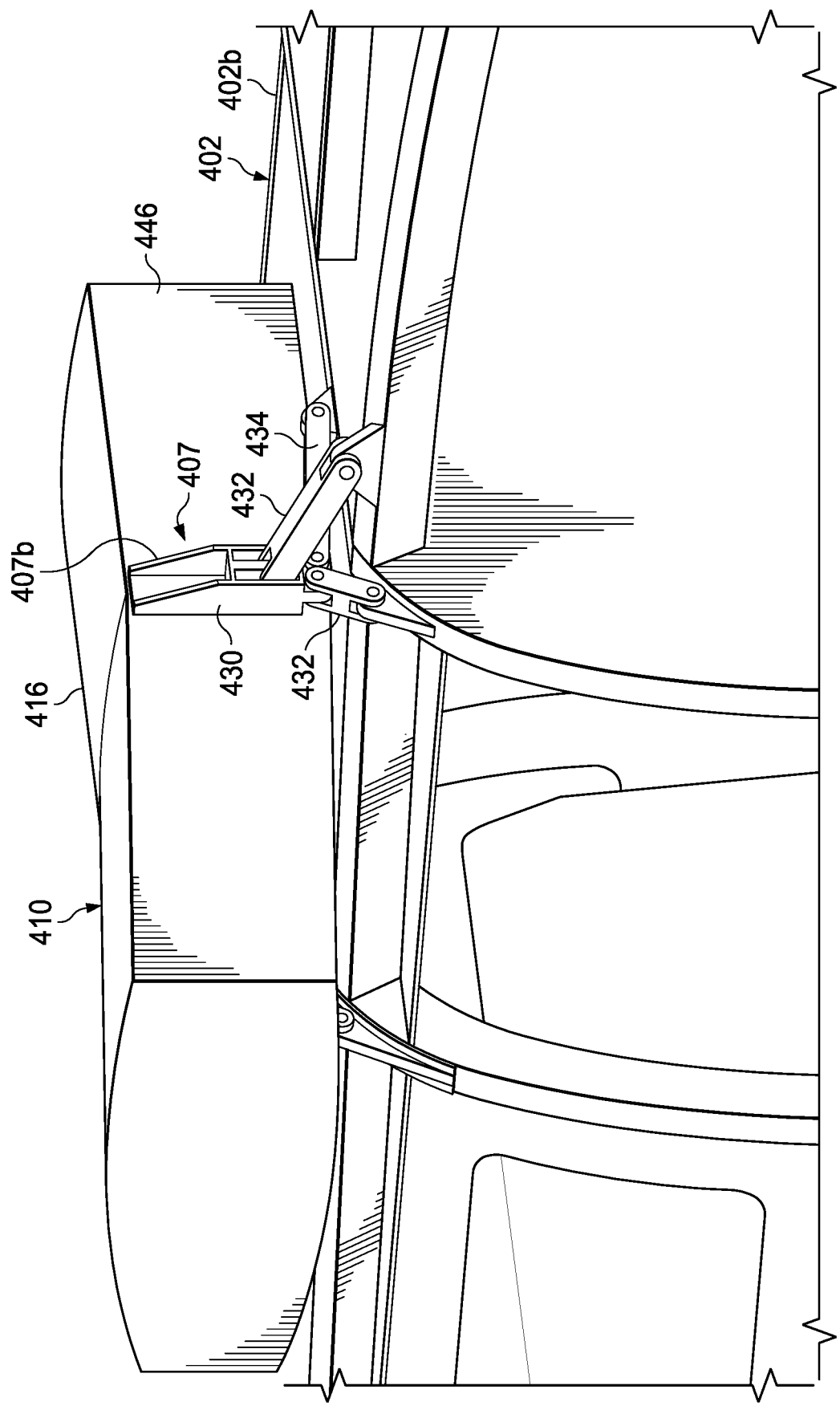
FIG. 6B is a perspective, partial cut away view of an aft wing mounting system, according to an embodiment.
Figure 7:
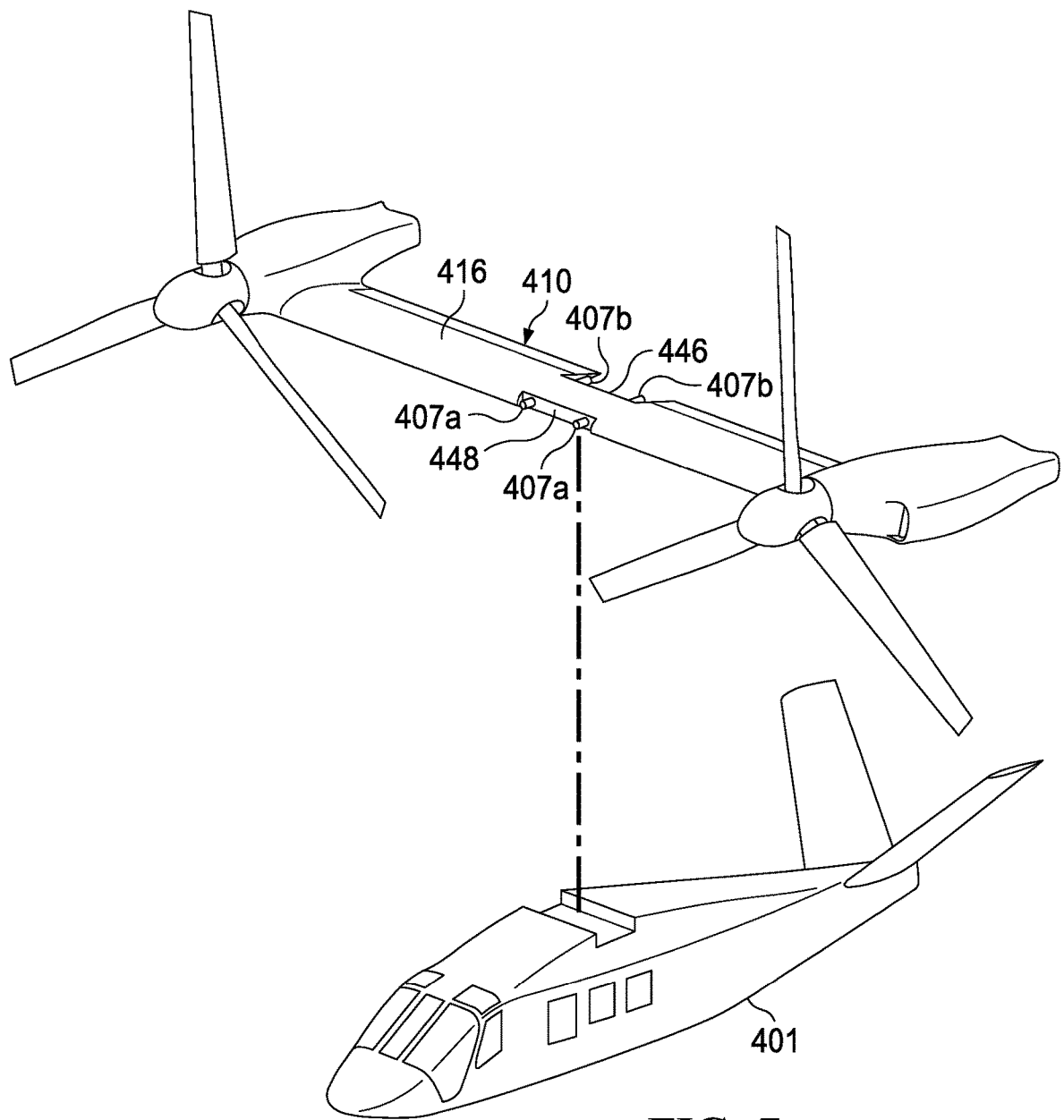
FIG. 7 is a perspective view of a lift propulsion module being assembled to a fuselage, according to an embodiment.

Referring to FIGS. 6A-6B and 7, an embodiment provides a method of manufacturing a tiltrotor aircraft includes assembling the lift propulsion module 410 and connecting a fuselage 401 to the mounting surface 446 of the assembled lift propulsion module 410 on a single production line. The step of connecting the fuselage 401 can include connecting a fuselage frame 402 to the mounting surface using a mounting system and connecting various systems as needed for the fuselage, for example, but not limited to, the power system 466, the fire suppression system 472, and flight control systems 468. In some embodiments, the fuselage 401 can include modular ports in the lift propulsion module 410 and the fuselage 401 for connecting systems therebetween (e.g., a modular electrical ports, modular hydraulic ports).

FIG. 6A shows a forward mounting system 407*a* for connecting the fuselage frame 402 to the mounting surface 448 on in a forward portion 402*a* of the fuselage frame 402. A second forward mounting system 407*a* is provided on the opposite corner of the forward portion of the fuselage frame 402. FIG. 6B shows an aft mounting system 407*b* for connecting the aft portion 402*b* of the fuselage frame 402 to the mounting surface 446 of the wing member 416. A second aft mounting system 407*b* is provided on the opposite corner of the aft portion 402*b* of the fuselage frame. In one embodiment, there are at least two forward mounting systems and two aft systems for structurally connecting the wing member 416 to the fuselage 402.

The forward and aft mounting systems 407*a*, 407*b* can each include a vertical attachment link 430, a longitudinal attachment link 432, and a lateral attachment link 434 as a linkage system designed for the load paths of the tiltrotor aircraft. In an exemplary embodiment, the forward mounting system 407*a* can include the vertical attachment link 430 and a longitudinal attachment link 434. The fuselage frame is rigidly attached to the links 430, 432, 434 and can include mounting members attached thereto for receiving the links 430, 432, 434 therein. In an embodiment, the links 430, 432, 434 are attached with pins through clevis and lug arrangements. In some embodiments, mono-ball bushings within the link and/or clevis would also avoid alignment issues as the links are being pinned. Additionally, in some embodiments the wing interface of the lift propulsion module 410 can be configured to be coupled to the fuselage 401 using a wing pivot mechanism for shipboard storage as described in U.S. Pat. Nos. 5,337,974 and/or 4,691,878. In an embodiment, lift propulsion module 410 can allow attachment to a fuselage 401 without wing fold, which can avoid the additional weight of the folding mechanism therein. In another embodiment, lift propulsion module 410 can include a wing fold mechanism if required by the compatible mission data set.

Though shown as a set of four mounting systems 407, it should be noted that other types of mounting systems or linkages may be used to connect the lift propulsion module 410 to the fuselage 402. The forward and aft mounting systems 407*a*, 407*b* can be engaged for mounting and disengaged for maintenance or repair.

In another embodiment, the lift propulsion module 410 can be connected and disconnected from the fuselage 401 to quickly replace either the lift propulsion module 410 or the fuselage 401 with a different fuselage. For example, the fuselage 401 can be a utility fuselage that could be substituted for a personnel fuselage as needed for commercial and/or military operations.

The illustrative embodiments of the lift propulsion module, systems and methods described herein override the routine and conventional sequence of designing and manufacturing a tiltrotor aircraft ordinary triggered by customer requirements in step 151 as shown in FIG. 3A. The illustrative embodiments of the systems and methods described herein result in a lift propulsion module that can be used with different types of fuselages, which overrides the routine and conventional sequence of events for designing and manufacturing a tiltrotor aircraft as shown in FIG. 3A.

The illustrative embodiments of the lift propulsion module, systems, and methods described herein advantageously provide at least one of the following: the commonality of the components in the lift propulsion module allows cost and time savings in aircraft production since different types of tiltrotor aircraft (commercial, military, and others) can be manufactured on a single production line; the lift propulsion module and fuselage can be quickly assembled and replaced; and spares and life cycle cost savings because less distinct spares are required needed as compared to conventionally designed and manufactured tiltrotor aircraft. For military tiltrotor aircraft, it is possible that a damaged lift propulsion module or fuselage may be replaced quickly so that aircraft downtime is minimized and total aircraft loss is avoided. For this reason, it is extremely important that lift propulsion module be interchangeable with various fuselages.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Terms such as "first" and "second" are used only to differentiate features and not to limit the different features to a particular order or to a particular quantity.

At least one embodiment is disclosed and variations, combinations, and/or modifications of the embodiment(s) and/or features of the embodiment(s) made by a person having ordinary skill in the art within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes 2, 3, 4, etc.; greater than 0.10 includes 0.11, 0.12, 0.13, etc.). For example, whenever a numerical range with a lower limit, $R_l$, and an upper, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Unless otherwise stated, the term "about" shall mean plus or minus 5 percent of the subsequent value. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrow terms such as consisting of, consisting essentially of, and comprised substantially of. Accordingly, the scope of protection is not limited by the description set out above but is defined by the claims that follow, the scope including all equivalents of the subject matter of the claims. Each and every claim is incorporated as further disclosure into the specification and the claims are embodiment(s) of the present invention.

The invention claimed is:

1. A method for facilitating the design and manufacturing of a tiltrotor aircraft, comprising the steps of:
   determining a compatible mission data set;
   identifying lift propulsion module components for the compatible mission data set;
   determining compatible specifications; and
   generating a design for a lift propulsion module, the lift propulsion module including a first rotor system, a second rotor system, and a wing member disposed between the first and second rotor systems, the wing member including a forward spar and an aft spar and further including at least a structural system comprising a leading edge, a trailing edge, first mounting surface formed from a notch in the trailing edge for connection of the wing aft spar to the fuselage, and a second mounting surface formed from a notch in the leading edge for connection between the wing forward spar and the fuselage;
   wherein the lift propulsion module is configured to be connected to at least two different fuselages, each fuselage connected to the lift propulsion module on the first and second mounting surfaces.

2. The method according to claim 1, wherein the determining a compatible mission data set, comprises the steps of:
   identifying at least two design missions;
   determining a performance value for each design mission;
   identifying constraints associated with the performance values;
   harmonizing the performance values; and
   optimizing the performance values.

3. The method according to claim 2, wherein the at least two design missions comprise a utility military mission, an attack military mission, and a commercial mission.

4. The method according to claim 2, wherein the at least two design missions are different.

5. The method according to claim 2, wherein the performance value comprises at least one of the following: speed, range, payload, loiter time, hover requirements, and aircraft weight.

6. The method according to claim 1, wherein the lift propulsion module components comprising a rotor system, a wing member, and operational systems therefor.

7. The method according to claim 1, wherein the identifying lift propulsion module components, further comprising:
   generating a mounting surface for the wing member based on the compatible mission data set, the mounting surface is configured to be connected with at least two different fuselages.

8. The method according to claim 1, wherein the at least two different fuselages are at least two of the following: a pressurized cabin, an unpressurized cabin, a cargo fuselage, a military fuselage, an unmanned aerial vehicle fuselage, and a military fuselage configured for shipboard wing and rotor stow.

9. The method according to claim 1, further comprising: providing the lift propulsion module.

10. The method according to claim 9, further comprising: providing a fuselage; and
    connecting the lift propulsion module and the fuselage.

11. The method according to claim 1, further comprising: manufacturing the lift propulsion module.

12. The method according to claim 11, wherein the lift propulsion module is manufactured separately from the fuselage.

13. The method according to claim 1, further comprising: generating a design for a fuselage.

14. The method according to claim 13, wherein the fuselage comprises at least one of the following: a pressurized cabin, an unpressurized cabin, a cargo fuselage, a military fuselage, an unmanned aerial vehicle fuselage, and a military fuselage configured for shipboard wing and rotor stow.

15. A method of designing a tiltrotor aircraft, comprising the step of:
    modularizing a lift propulsion system, including the steps of
    determining compatible specifications includes identifying certification and airworthiness requirements, the certification and airworthiness requirements include at least one of the following a commercial certification and a military certification; harmonizing the certification and airworthiness requirements; and optimizing the certification and airworthiness requirements; and
    generating a design for a lift propulsion system based on the compatible specifications, the lift propulsion system includes a lift propulsion module including a first rotor system, a second rotor system, and a wing member disposed between the first and second rotor systems, the wing member including a forward spar and an aft spar and further including at least a structural system comprising a leading edge, a trailing edge, first mounting surface formed from a notch in the trailing edge for connection of the wing aft spar to the fuselage, and a second mounting surface formed from a notch in the leading edge for connection between the wing forward spar and the fuselage;
    wherein the lift propulsion module is configured to be connected to at least two different fuselages, each fuselage connected to the lift propulsion module on the first and second mounting surfaces.

16. A tiltrotor aircraft comprising:
    a fuselage; and
    a lift propulsion module, the lift propulsion module comprising a first rotor system, a second rotor system, and a wing member disposed between the first and second rotor systems, the wing member including a forward spar and an aft spar and further including at least a structural system comprising a leading edge, a trailing edge, a port end and a starboard end, and an upper airfoil surface and a lower airfoil surface that form an airfoil assembly, and wherein the structural system further includes a first mounting surface formed from a notch in the trailing edge for connection of the wing aft spar to the fuselage and a second mounting surface formed from a notch in the leading edge for connection between the wing forward spar and the fuselage;

wherein the lift propulsion module is coupled to the fuselage on the first and second mounting surfaces.

* * * * *